(12) United States Patent
Roberts et al.

(10) Patent No.: US 7,474,974 B2
(45) Date of Patent: Jan. 6, 2009

(54) EMBEDDED TIME DOMAIN ANALYZER FOR HIGH SPEED CIRCUITS

(75) Inventors: Gordon W. Roberts, Montreal-West (CA); Mouna Safi-Harab, Ville Saint Laurent (CA); Mourad Oulmane, Montreal (CA)

(73) Assignee: McGill University, Montreal, Quebec (CA)

( * ) Notice: Subject to any disclaimer, the term of this patent is extended or adjusted under 35 U.S.C. 154(b) by 0 days.

(21) Appl. No.: 11/699,997

(22) Filed: Jan. 31, 2007

(65) Prior Publication Data

US 2008/0183409 A1    Jul. 31, 2008

(51) Int. Cl.
G01R 29/02    (2006.01)

(52) U.S. Cl. ............... 702/79; 370/241; 370/252; 714/724; 714/731; 455/67.11

(58) Field of Classification Search ............... 702/57, 702/58, 66, 67, 77, 78, 79; 375/224, 225, 375/22; 455/1, 4.1, 67.11, 115.1, 115.3, 455/226.1, 226.2, 115.2, 423, 454; 370/241, 370/252; 714/724, 731; 348/193, 181, 192; 315/393, 392; 327/336, 237, 263, 264, 94
See application file for complete search history.

(56) References Cited

U.S. PATENT DOCUMENTS

| | | | |
|---|---|---|---|
| 4,631,423 A | | 12/1986 | Faris |
| 4,906,916 A | * | 3/1990 | Koslar ............... 324/121 R |
| 5,122,731 A | * | 6/1992 | Cole ............... 324/76.26 |
| 5,428,626 A | * | 6/1995 | Frisch et al. ............... 714/744 |
| 6,194,925 B1 | * | 2/2001 | Kimsal et al. ............... 327/132 |
| 6,346,907 B1 | | 2/2002 | Dacy et al. |
| 6,351,231 B1 | | 2/2002 | Price et al. |
| 6,564,187 B1 | | 5/2003 | Kikumoto et al. |
| 7,113,749 B2 | * | 9/2006 | Smith et al. ............... 455/67.11 |
| 2005/0013355 A1 | * | 1/2005 | Smith et al. ............... 375/224 |

FOREIGN PATENT DOCUMENTS

JP    2003/114253 A2    4/2003

OTHER PUBLICATIONS

S. Delmas Ben-Dhia et al, "On-Chip Sampling in CMOS Integrated Circuits" IEEE Trans. Of Elec. Comp. vol. 41, No. 4, pp. 403-406, Nov. 1999.

(Continued)

Primary Examiner—Carol S Tsai
(74) Attorney, Agent, or Firm—Freedman and Associates

(57) ABSTRACT

A method of providing an on-chip high-speed time domain digital analyzer for the characterization and analysis of signals within an integrated circuit is provided. The method involves processing the signal being characterized/analyzed in the digital domain irrespective of it's starting format. The approach performs a voltage-to-time conversion using predetermined voltage thresholds, applying a time amplification to the digital time information, measuring the amplified time difference between events and converting the amplified time difference as required by the characterization/analysis. The method allows the capture of very high-speed signals with high resolution without the requirements of complex and high-speed electronics. As such the on-chip high-speed time domain digital analyzer can function as an oscilloscope, pulse width analyzer, rise time analyzer and even logic analyzer. Further the method allows the capture and analysis of single and non-repetitive signal events unlike prior art approaches to time domain oscilloscopes.

82 Claims, 16 Drawing Sheets

OTHER PUBLICATIONS

R. Ho et al; "Applications of On-Chip Samplers for Test and measurement of Integrated Circuits" Dig. IEEE Symposium of VLSI Circuits, pp. 138-139, Jun. 1998.

M. Takamiya et al, "An On-Chip 100GHz Sampling Rate 8-Channel Sampling Oscilloscope with Embedded Smapling Clock Generator", Dig. IEEE ISSCC, vol. 1, Session 11, Paper 11.2, Feb. 2002.

G.W. Roberts et al, "A 4-GHz Effective Sample Rate Integrated Test Core for Analog and Mixed Signal Circuits", IEEE JSSC, vol. 37, No. 4, pp. 499-514, Apr. 2002.

M.M. Hafed and G.W. Roberts, "A 5-Channel Variable Resolution 10GHz Sampling Rate Coherent Tester / Oscilloscope IC and Associated Test Vehicles", Proc. IEEE CICC, pp. 621-624, Sep. 2003.

K.L. Shepherd and Y. Zheng, "On-Chip Oscilloscope for Non-Invasive Time-Domain Measurements of Waveforms in Digital Integrated Circuits", IEEE Trans. On VLSI Systems, vol. 11, No. 3, pp. 336-344, Jun. 2003.

B. Vrignon et al, "Measurement and Prediction of Electromagnetic Emissions from Integrated Circuits", Proceedings of IEEE Conference of Electromagnetic Compatibility Aug. 2004.

H. Yang and R.Sarpeshkar, "A Time-Based Eergy Efficient Analog-to-Digital Convertor", IEEE J. Solid State Circuits, vol. 40, No. 8, Aug. 2005, pp. 1590-1601.

\* cited by examiner

EMBEDDED TIME DOMAIN ANALYZER FOR HIGH SPEED CIRCUITS

FIELD OF THE INVENTION

The invention relates to performing time domain measurements of electronic circuits, and particularly to embedding of time domain analyzer functions into high-speed integrated circuits.

BACKGROUND OF THE INVENTION

Design for Test (DFT) has gone in recent years from a somewhat beneficial feature to a necessity within integrated circuits. Originally focused on digital circuits with the inclusion of circuit elements for Built-In Self-Test (BIST), and subsequently expanding to Built-In Test Equipment (BITE), the DFT methodology has now penetrated all areas of electronics and IC design, but is especially important with increasing operational speeds and increased integration in analog and mixed signal circuits where demands for performance, reliability, and defectivity are increasing whilst customer continually demand decreasing costs and guaranteed supply.

The motivations to employ DFT strategies in IC design are not always obvious at the first glance. Implementing DFT into an IC typically results in add-on test circuitry, which does not improve the primary circuit functions. It does not make a circuit faster, it does not reduce the power consumption, and it does not make it more robust to variations of process or environmental parameters. Even worse, the circuitry for testing adds additional problems. Circuit performance may be degraded, if for example switching elements are added into signal paths. Chip complexity increases, and a particularly elegant circuit solution is often questionable after test circuitry has "ruined" the layout.

DFT strategies are not merely an add-on module to an existing, and working, circuit solution but dominantly shape the semiconductor circuit solution, by for example determining the module boundaries, bring limitations and restrictions to the freedom of the analog designer and of the circuit implementation, and require additional circuitry which increases the die area, therefore increasing the die manufacturing costs and increasing the probability of faults in the chip.

As such a driving force to utilize DFT for analog and mixed signal ICs comes from market demands identified previously. One main reason for DFT is to reduce the (final) costs of ICs through reducing testing time. Testing a mixed-signal chip after production is typically responsible for between 30% and 80% of the total cost, depending on chip system complexity, volume, and application demands. Furthermore, DFT increases the testability per definition and, therefore, increases the fault coverage, which in turn increases the reliability of a circuit in the field by reducing early life failures. This is particularly important where industry trends are to single figure part per million (ppm) failures.

Another main reason to employ DFT for ICs is the demands from safety critical, highly dependable, and high reliability applications. Complex solutions for the health, nuclear, or transportation industries including automotive, aerospace and public transportation applications demand high testability and on-line functional verification to allow safe, dependable and reliable operation. Furthermore, legislative requirements and demands from insurers in many cases necessitate proof of "completeness" in testing after manufacture and even continuing on-line verification capabilities for certain applications. As such DFT evolves from a mere idea to make the test engineers life easier to a concept which is paramount to successful IC design, production, marketing, and sales.

DFT techniques evolved primarily from the digital circuit domain, and the vast majority of DFT approaches exploit digital circuits to communicate with other circuitry, perform analysis, and are digital circuits themselves. However, with digital circuits routinely operating at 10 Gb/s and above in telecommunications and developments extending to 40 Gb/s and 100 Gb/s, the line between digital and analog signals is increasingly blurring. Analog signals are often considered to be continuous signals but today's systems can operate with multiple modulation formats, frequency agility, short aperiodic bursts and digital encoding. Hence, the original differentiations between analog and digital test equipment are disappearing and circuit designs at these high speeds and operating frequencies becoming more synergistic in building blocks, semiconductor technology and testing requirements.

Historically, the design of "analog" circuits has been one with significantly less design automation than digital circuits, and is further compounded by supporting multiple semiconductor technologies such as SiGe, GaAs, and InP rather than simply silicon. As such whilst an analog element of a mixed signal IC may take up only 5-10% of the die footprint it's design can take 80-90% of the development time and it's production testing a similar proportion of test time.

As a result there has been interest in expanding the overall embrace of DFT into circuits by expanding the BIST/BITE toolset with the inclusion of an on-chip oscilloscope function such that critical parameters such as rise-time, fall-time, eye-opening, jitter, and noise can be measured automatically in real-time within the circuit. Conventional automated test equipment (ATE) for high-speed characterization of signals has centered on digital oscilloscopes, and their closely related counterpart the logic analyzer. Prior art has addressed elements of reducing either the complexity or requirements of the ATE whilst beginning the first steps of integrating the required functionality into an IC.

Prior art has therefore tended to either mimic the design of conventional time-domain oscilloscopes or provide an interface to such conventional instruments. As such prior circuits providing the special focus on BITE have addressed the issue of sampling the high-speed signals with an integrated circuit block thereby allowing the signal integrity within a mixed signal IC to be evaluated. Such an approach was reported by Delmas Ben-Dhia et al; (S. Delmas Ben-Dhia et al, "On-Chip Sampling in CMOS Integrated Circuits" IEEE Trans. Of Elec. Comp. Vol. 41, No. 4, pp 403-406, November 1999), to evaluate CMOS circuits. This integrated sampling approach has been extended by Ho et al, (R. Ho et al; "Applications of On-Chip Samplers for Test and measurement of Integrated Circuits" Dig. IEEE Symposium of VLSI Circuits, pp 138-139, June 1998), where the sampling allowed the evaluation of the VLSI circuit with a lower speed external oscilloscope.

In fact, these prior art solutions sought to address the cost of automated test equipment by embedding the high speed sampling circuit within the VLSI IC, an SRAM in the case of Ho et al, and coupling this circuit block to conventional logic analyzer/oscilloscope units external to the IC. Digitization or analysis of the signal within the IC was performed externally to the IC in these prior art approaches. Typically, signal digitization in the prior art was undertaken using external analog buffers and analog-to-digital (ADC) circuits, generally within conventional laboratory test instruments.

A step further in integration from the sampling circuit is the provisioning of the measurement clock signals necessary to control the BITE circuitry. Such measurement clock signals having been at lower speeds than the IC clock signals in these prior art solutions which address repetitive high speed signals, but would need to be at higher speeds than the IC clock signals in real time, single shot characterization and evaluation circuits for DFT, especially in capturing error events and on-line real time analysis. Such on-chip clock generation was demonstrated in the prior art by Takamiya et al, (M. Takamiya et al, "An On-Chip 100 GHz Sampling Rate 8-Channel Sampling Oscilloscope with Embedded Sampling Clock Generator", Dig. IEEE ISSCC, Vol. 1, Session 11, Paper 11.2, February 2002), wherein the sampling clock generator was integrated with 8-sampling circuits such as typically implemented within a laboratory style logic analyzer. The approach is also outlined within Japanese Patent Application 2003/114253.

However, again only sampled signals were generated on-chip and digitization was again performed off-chip within conventional test instrumentation. Prior art digitization has been restricted to simple solutions, such as the single comparator approach of Roberts et al, (G. W. Roberts et al, "A 4-GHz Effective Sample Rate Integrated Test Core for Analog and Mixed Signal Circuits", IEEE JSSC, Vol. 37, No. 4, pp. 499-514, April 2002) wherein the functional integration was increased, or Roberts and Hafed, (M. M. Hafed and G. W. Roberts, "A 5-Channel Variable Resolution 10 GHz Sampling Rate Coherent Tester/Oscilloscope IC and Associated Test Vehicles", Proc. IEEE CICC, pp. 621-624, September 2003) where external clock circuits allowed for increased speed of operation.

By extending the circuit with voltage sweeping, the circuit could perform as an on-chip tester with minimum circuit overhead. The voltage sweeping resulting in multiple thresholds such that in conjunction with digital memory digital representations of the signal could be generated. However, common to such prior art comparator based approaches the simplicity was traded off against increased test time, due to requiring the reference voltage to be swept over all possible levels and settle for each "measurement".

A variation to this is the successive approximation approach to analog-to-digital conversion; see for example the prior art by Price and McIntosh, (C. Price and C. McIntosh, "Successive Approximation Analog-to-Digital Converter" U.S. Pat. No. 6,351,231). This form of ADC having been shown integrated with a sampling circuit by Shepherd and Zheng, (K. L. Shepherd and Y. Zheng, "On-Chip Oscilloscope for Non-Invasive Time-Domain Measurements of Waveforms in Digital Integrated Circuits", IEEE Trans. On VLSI Systems, Vol. 11, No. 3, pp. 336-344, June 2003).

In mimicking conventional instrumentation, and also simplifyng the BITE circuit block these prior art solutions have relied for the most part on under sampling, see for example FIG. 3 in "Measurement and Prediction of Electromagnetic Emissions from Integrated Circuits" by B. Vrignon et al in Proceedings of IEEE Conference of Electromagnetic Compatibility August 2004. Such under sampling allows the ATE to capture a repetitive high-speed signal with a resolution of a predetermined time interval, which is set by a delay circuit generator, at a relatively low capture rate. Using the multipass approach basically allows the use of the same comparator in many iterations (passes) while varying the DC reference voltage in every new iteration. Hardware complexity is decreased at the expense of increased test time due to the dual-loop system.

Importantly the under sampling approach does not allow the capture of single events, such as occur with one-off error events within ICs or systems measuring nuclear interactions, or even those operating in safety critical or high reliability situations where on-line functional verification is required. In these instances there is no repetition, and the prior art solutions could only provide a solution with the further integration of a recirculating delay line capable of providing the multiple repetitions of the signal being characterized.

It would be advantageous therefore to provide an on-chip high-speed time domain analyzer that supports requirements of DFT and BITE processes but also provides the capability to analyze and characterize signals in real time such as a single error event pass of a signal through the BITE circuit. It would be further advantageous for the solution not to require high speed digital or mixed signal circuits operating faster than the actual IC they are characterizing. Finally the solution should be implementable without significant manufacturing costs and technical requirements that offset the financial benefits of providing the functional analysis and characterization on-chip. Such an on-chip high-speed time domain digital analyzer could function as an oscilloscope, pulse width analyzer, rise time analyzer and even logic analyzer.

SUMMARY OF THE INVENTION

It is an object of some embodiments of the invention to provide an on-chip high-speed time domain analyzer for integration within semiconductor circuits.

In accordance with the invention there is provided a method for analysis of high speed signals comprising the steps of:

a) providing a signal;

b) providing at least a voltage threshold, each voltage threshold of the at least a voltage threshold being set at predetermined voltage for analysis of the signal;

c) establishing at least two of a plurality of time events, at least one of the plurality of time events relating to the signal crossing a voltage threshold of the at least a voltage threshold;

d) generating amplified time events by amplifying the time axis between the plurality of time events, the time amplification being determined by at least an amplification factor;

e) determining an amplified separation, the amplified separation being determined in dependence upon a time difference between at least two of the plurality of amplified time events; and f) providing an output result, the output result comprising information relating to at least one of the time events and the amplified time events.

In accordance with another embodiment of the invention there is provided a method of analysis of high speed signals comprising the steps of:

a) providing a signal;

b) providing at least a voltage threshold, the voltage threshold being set at predetermined voltage for analysis of the signal;

c) establishing at least two of a plurality of time events, at least one of the plurality of time events relating to the signal crossing the voltage threshold;

d) providing a time amplifier, the time amplifier for generating amplified time events by amplifying the time axis between the plurality of time events, the time amplifier being characterized by at least an amplification factor;

e) determining an amplified separation, the amplified separation being determined in dependence upon a time difference between at least two of the plurality of amplified time events;

f) determining an output result in dependence upon the amplified time results and a time difference between the at least two of the plurality of time events; and, providing the output result.

In accordance with another embodiment of the invention there is provided a method of analyzing high speed signals comprising the steps of:

a) providing a signal;
b) providing at least a voltage threshold, the voltage threshold being set at predetermined voltage for analysis of the signal;
c) establishing at least two of a plurality of time events, at least one of the plurality of time events relating to the signal crossing the voltage threshold;
d) generating amplified time events by amplifying the time axis between the plurality of time events, the time amplification being determined by at least an amplification factor;
e) providing a time-to-data converter, the time-to-data converter for determining a time difference between at least two of the plurality of amplified time events; and
f) providing an output result, the output result comprising information determined in dependence upon the amplified time results and a time difference between at least two of the plurality of time events.

In accordance with another embodiment of the invention there is provided a method of analyzing a high speed signal comprising the steps of:

a) providing a sampled signal;
b) providing a plurality of voltage thresholds, each of the plurality of voltage thresholds being a predetermined voltage for analysis of the signal;
c) establishing at least two of a plurality of time events, at least one of the plurality of time events relating to the signal crossing one of the plurality of voltage thresholds;
d) generating amplified time events by amplifying the time axis between the plurality of time events, the time amplification being determined by at least an amplification factor;
e) determining an amplified separation, the amplified separation being a time difference between at least two of the plurality of amplified time events; and
f) determining an output result in dependence upon the amplified time results and a time difference between at least two of the plurality of time events; and,
g) providing the output result.

In accordance with another embodiment of the invention there is provided an integrated circuit for analyzing a high speed signal comprising:

i) a signal circuit, the signal circuit for providing a signal, the signal being a high-speed signal;
ii) a voltage threshold circuit, the voltage threshold circuit for providing at least a voltage threshold, the at least a voltage threshold being set at predetermined voltage for analysis of the signal;
iii) a time event circuit, the time event circuit for establishing at least two of a plurality of time events, each of the plurality of time events relating to the signal crossing the at least a voltage threshold;
iv) a time amplifier, the time amplifier for generating amplified time events by amplifying the time axis between the plurality of time events, the time amplification being determined by at least an amplification factor;
v) a timing circuit, the timing circuit for determining an amplified separation, the amplified separation being a time difference between at least two of the plurality of amplified time events; and vi) a result circuit, the result circuit for providing an output result, the output result comprising information determined in dependence upon the amplified time results and a time difference between at least two of the plurality of time events.

DETAILED DESCRIPTION OF EMBODIMENTS OF THE INVENTION

Figure 1:
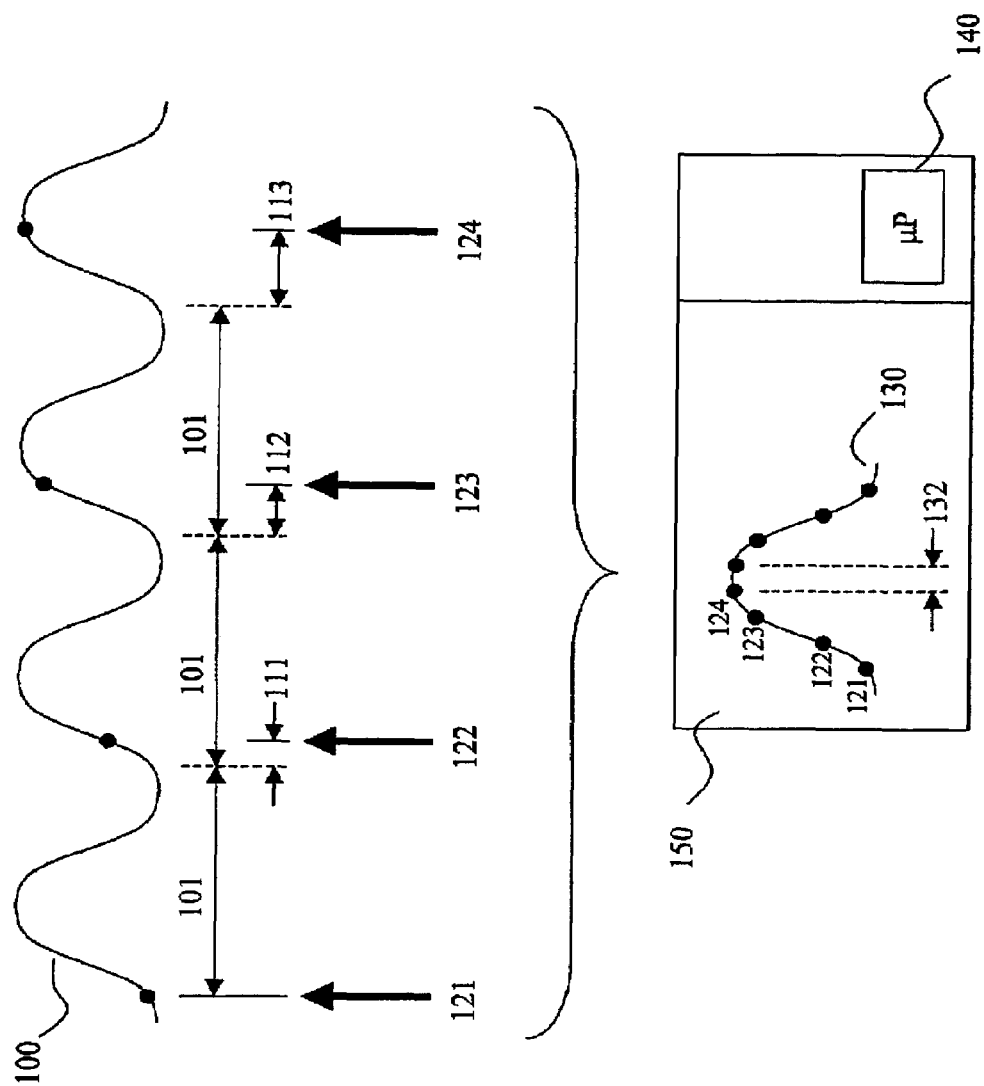
FIG. 1 illustrates the prior art approach of under-sampling to characterize a high-speed signal.

Referring to FIG. 1, illustrated schematically is the prior art approach of under-sampling to characterize a high-speed signal. Shown is a repetitive waveform 100 having a period ΔT 101, which is sampled with a sampling instrument at initial time point 121 and subsequent time points 122, 123, and 124. The subsequent time points 122, 123 and 124 are delayed sequentially relative to each preceding time point 121, 122, and 123 respectively by δT. As a result, the second sampling point 122 is delayed by a delay 111 equal to δT, the third sampling point 123 is delayed by an overall delay 112 of 2δT, and the fourth sampling point 124 is delayed by an overall delay 113 of 3δT relative to the repeating waveform 100 of period ΔT 101.

The resulting samples 121 through 124 are then processed by a processor 140, which takes the sampled signals from the sampling head (not shown for clarity) and drives an oscilloscope display 150. This results in each of the sampled points 121 through to 124 being positioned in appropriate time position (X-axis) relative to the other sampled points 121 through 124 with separation 132 on the X-axis being equivalent to the incremental delay δT, and the Y-displacement being determined by the measured signal magnitude at each of the sampled points 121 through 124. The result is a reconstituted waveform 130, which represents a predetermined segment of the repeating waveform 100.

Figure 2:
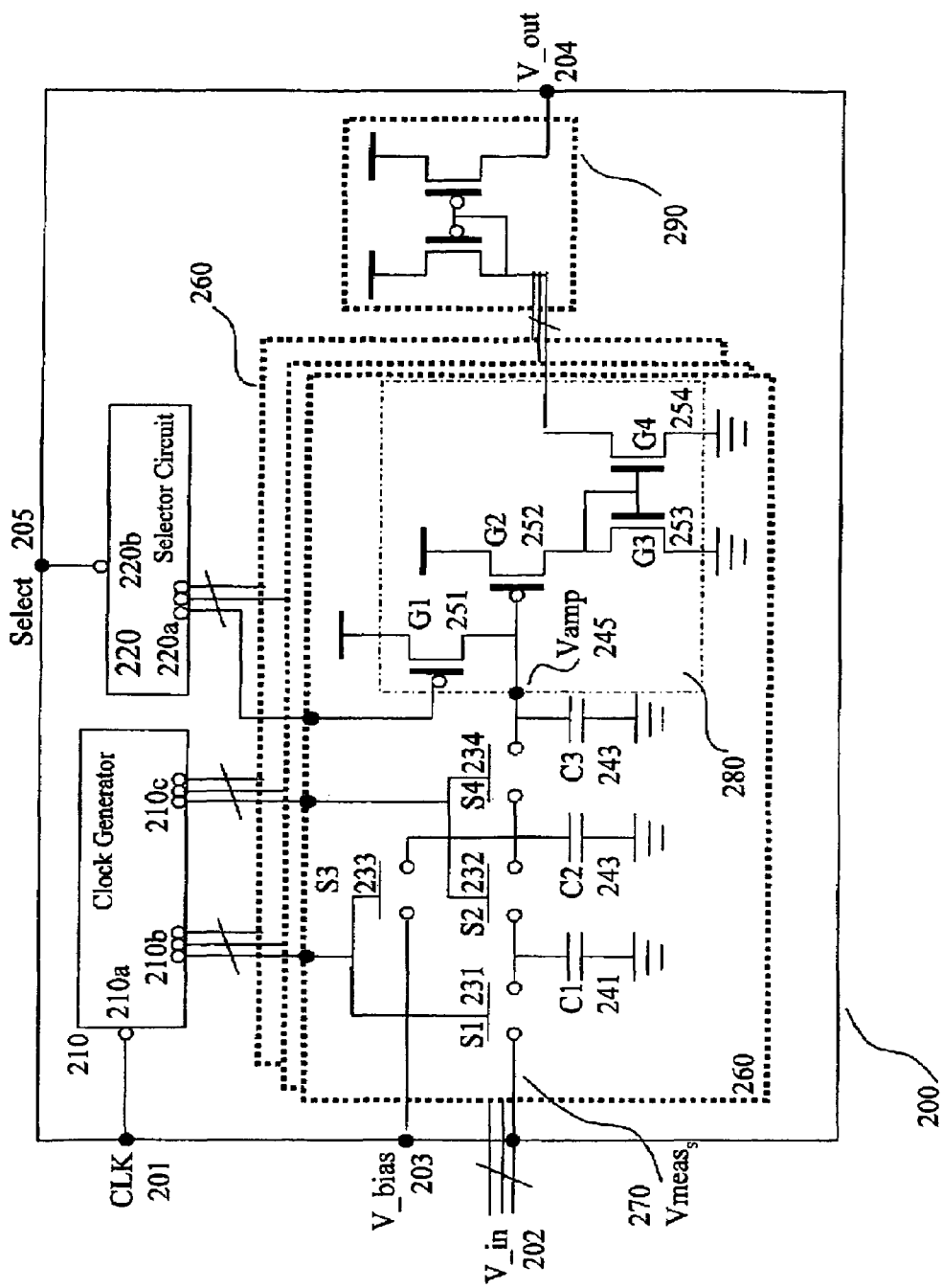
FIG. 2 illustrates a prior art embodiment of a high speed sampling circuit for CMOS integrated circuits.

Now referring to FIG. 2 shown is a prior art embodiment of a high speed sampling circuit 200 for CMOS integrated circuits. The sampling circuit 200 provides 8 channel sampling through the replication 8 times of a sampling header circuits 260, the sampler header circuits being interfaced to a selector circuit 220 and a clock generator 210. External electrical connections, apart from the power supplies and ground connections which are not shown for clarity, a low frequency external clock applied at a clock port 201, a header bias voltage V_bias at bias port 203, select port 205, header output signal V_out at output port 204, and the 8 voltage signals V_in provided at sampler port 202.

The selector circuit 220 has a selector port 220b electrically coupled to the select port 205 such that control data applied to select port 205 is coupled to the selector circuit 220. The selector circuit 220 then enables the selected sampling header circuit 260 by enabling an appropriate port 220a of the selector circuit 220, each port 220a being electrically coupled to a control transistor G1 251 in each of the sampling header circuits 260.

A clock generator 210 receives an external low frequency clock signal provided at the clock port 201 at port 210a and generates two sampling clock signals. A first clock signal SMPCLK is provided at an array of outputs 210b coupled to a first sampling switch S1 231 of each sampling header circuit 260, the first sampling switch S1 231 toggles a V_bias signal applied at port 203 on and off through a second switch S3 233. A second clock signal $\overline{SMPCLK}$ is also provided at a second array of outputs 210a, and is coupled to third and fourth sampling switches S2 232 and S4 234.

Now addressing each sampling header circuit 260, the voltage to be measured is present as $V_{meas}$ 270 is coupled from the one of the sampler ports 202 to first sampling switch 221. The first sampling switch S1 221 therefore couples $V_{meas}$ 270, periodically charging a first sampling capacitor C1 241, effectively samples the measured voltage. This sampled voltage is then periodically coupled to a second sampling capacitor C2 242 by the operation of second sampling switch S2 222. Likewise this signal is then periodically coupled to a third sampling capacitor C3 243 through operation of the fourth sampling switch S4 234. This voltage V_amp 245 is then coupled to a sampling head amplifier 280.

The sampling head amplifier 280 comprises the control transistor G1 251, and three gain transistors G2 252, G3 253, and G4 254 respectively. The output port of the sampling head amplifier 280 is then coupled to an output buffer 290 before being coupled to the output port 204.

In operation C1 241 samples the measured voltage $V_{meas}$ 270, C2 242 reduces a range of Vmeas 270 to an acceptable range of the sampling head amplifier 280, and C3 243 holds the measured voltage $V_{meas}$ 270. When S1 231 and S3 233 are closed; S2 232 and S4 234 are opened, the voltage in C1 241 becomes equal to $V_{meas}$ 270, while that in C2 242 becomes equal to the bias voltage, being approximately the center value of the voltage range of the sampling head amplifier 280 in the sampling header circuit 260. When S1 231 and S3 233 are opened; S2 232 and S4 234 are closed, C1 241, C2 242, and C3 243 share their charges amongst one another. By adjusting C1 241, C2 242, and C3 243, the signal at the output port of C3 243, Vamp 245, is made to lie within the voltage range of the sampling head amplifier 280.

Figure 3:
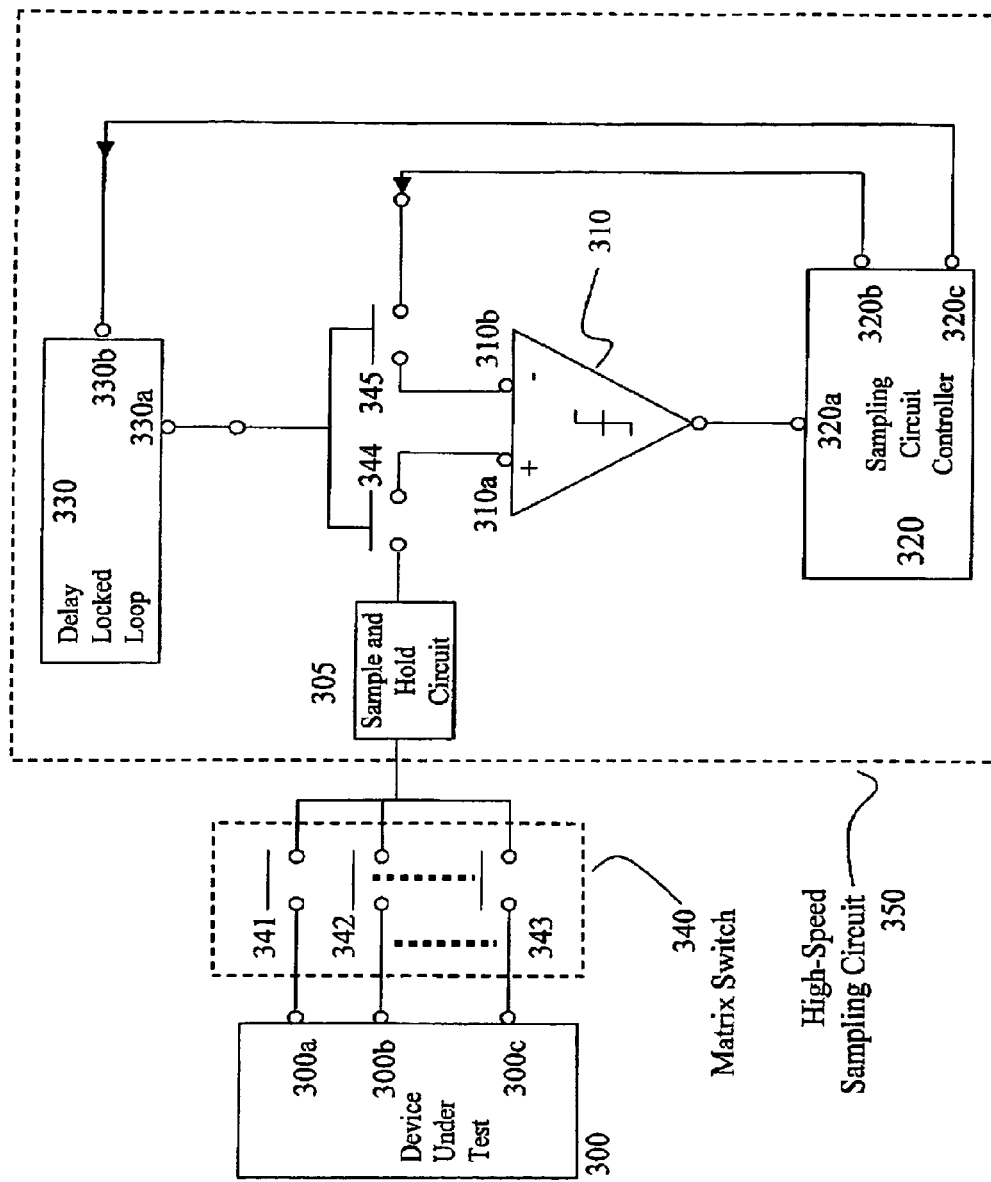
FIG. 3 illustrates a prior art embodiment of a high-speed sampling circuit.

Referring to FIG. 3, shown is a prior art embodiment of another high-speed sampling circuit 350. Shown is a device under test (DUT) 300, which has a plurality of monitoring ports 300a, 300b, and 300c. The monitoring ports 300a through 300c are then coupled to a switch matrix 340 comprising an array of switch elements 341 through 343. The currently selected monitoring port of the monitoring ports 300a through 300c is coupled to sample-and-hold circuit 305 through the switch matrix 340.

The output signal from the sample-and-hold circuit 305 is periodically coupled to one port 310a of a comparator 310 by a first gating switch 344. The first gating switch 344 is coupled to a clock output port 330a of a delay-locked loop (DLL) 330. The clock output port 330a is also coupled to second gating switch 345, which provides a gated DC reference voltage for the comparator 310. The DC reference voltage is coupled to port 310b of the comparator 310 and is provided from an output port 320b of sampling circuit controller 320. The sampling circuit controller 320 also provides from a second output port 320c appropriate signaling information to port 330b of the DLL 330 so that the phase of the DLL 330 is updated. This updating is performed N times for an N-stage DLL. In operation therefore the comparator 310 performs a one-bit ADC function, which driven from the DLL results in sampling of the signal repetitively with a time resolution of ΔT provided by the DLL.

Using this approach in a multiple pass configuration allows a waveform to be sampled with relatively low speed electronics, when the waveform is repetitive in nature, and allows for rebuilding of the repetitive waveform as with a conventional time domain oscilloscope. If, the DC reference voltage provided by the sampling circuit controller 320 is varied in a new iteration, then operating both loops continuously results in an under sampled multi-pass digitizing oscilloscope. Advantageously hardware complexity is considerably reduced but at the expense of significantly increased test time as both loops must completely cycle to digitize a waveform, and without the ability to capture/analyze single events.

Figure 4:
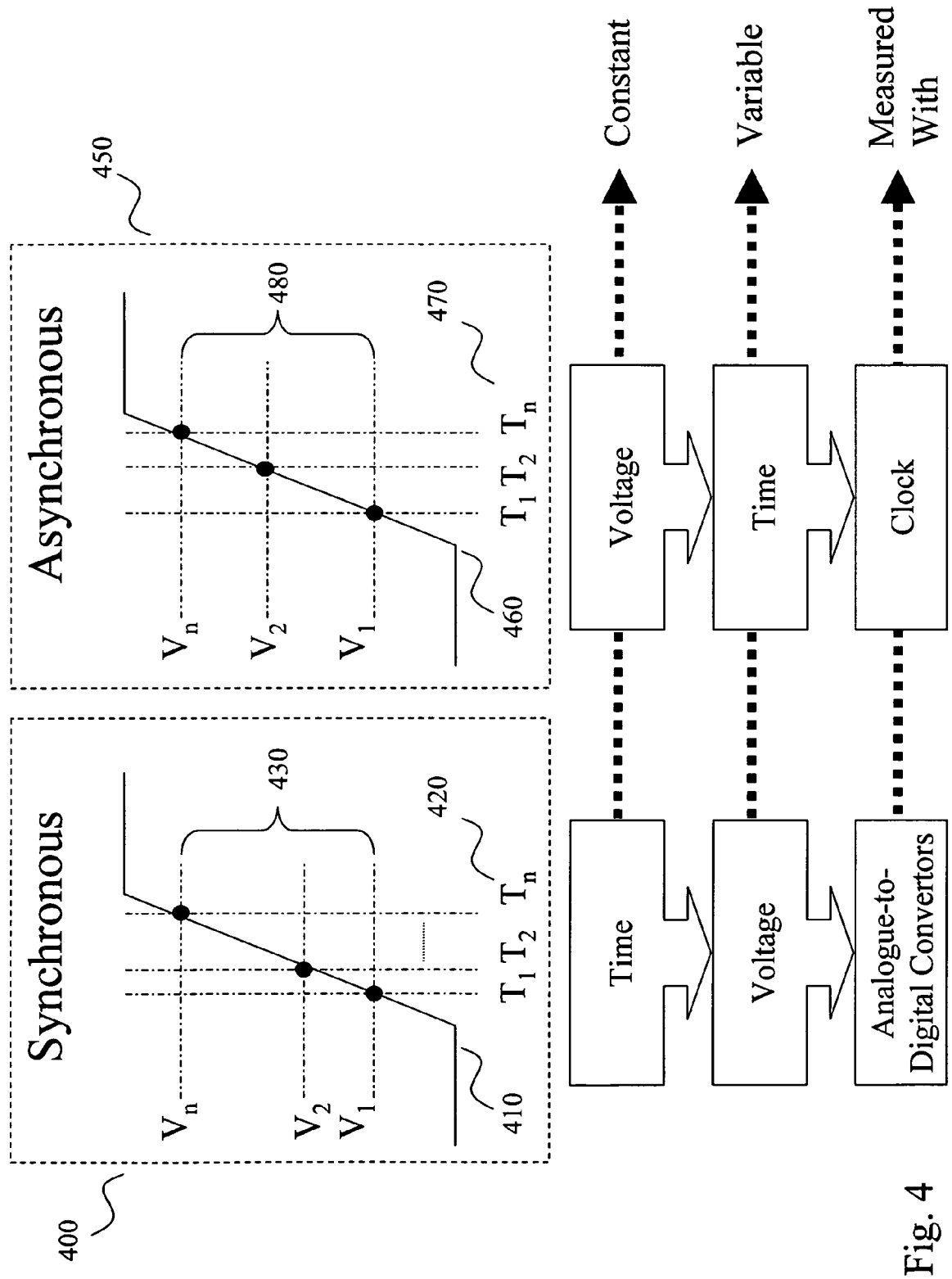
FIG. 4 illustrates two approaches to sampling a voltage waveform and the requirements for measurement instrumentation.

Now referring to FIG. 4 shown are two approaches to sampling a voltage waveform and measurement instrumentation, namely synchronous sampling 400 and asynchronous sampling 450. The synchronous sampling 400 samples voltage waveform 410 using a series of discrete time based samples 420. Depending upon the balance of repetitive waveform versus single event capture, circuit complexity and acquisition speed, the time sampling circuitry varies substantially. To achieve 100 samples across a given window ΔT with a single event requires 100 sampling circuits, whereas with a repetitive waveform a single sampling circuit. As such the latter has been adopted within conventional time domain oscilloscopes and prior art on-chip implementations as very high speed sampling circuits are expensive as well as costly in terms of semiconductor wafer footprint.

Each of the resulting time samples 420 generates measurement voltage samples 430. Subsequent extraction of stored digital representations of the measurement voltage samples 430 in the sequence of the time samples 420 allows the waveform to be reconstructed or analyzed. Constant time based sampling results in a variable voltage measurement, which is digitized using analog-to-digital converter (ADC) circuitry. The time based samples 420 can be established very accurately with a single clock and digitization of the voltage samples 430 at the reduced speed of the periodic repetitive sampling allows accuracy to be increased with increased bit-count of the ADCs, such that the error in measurement is attributable to voltage quantization of the ADCs.

In contrast, asynchronous sampling 450 establishes predetermined voltage thresholds 480 and it is detection of the waveform 460 crossing these voltage thresholds 480 that leads to a series of time trigger events 470. Constant voltage references, which are easily generated, are converted to variable time trigger events 480, which can be measured using a generated clock. As noted above, the ease of generating high stability clocks has justified other solutions favoring synchronous sampling 400 over asynchronous sampling 450. As such asynchronous sampling actually presents an excellent solution and one that is also capable of handling single events unlike the complexity reduced synchronous sampling 400, which relies upon repetitive waveforms. The drawback traditionally has been that time samples 480 require a clock with excellent stability and having a speed significantly higher than that of the waveform being measured. For example, if measuring a 1 ns digital signal rise time with 10 ps accuracy, the clock stability is ideally close to 1 ps, and hence the clock for the time-domain measurements is orders of magnitude faster than the clock of the digital signal being analyzed.

Figure 5:
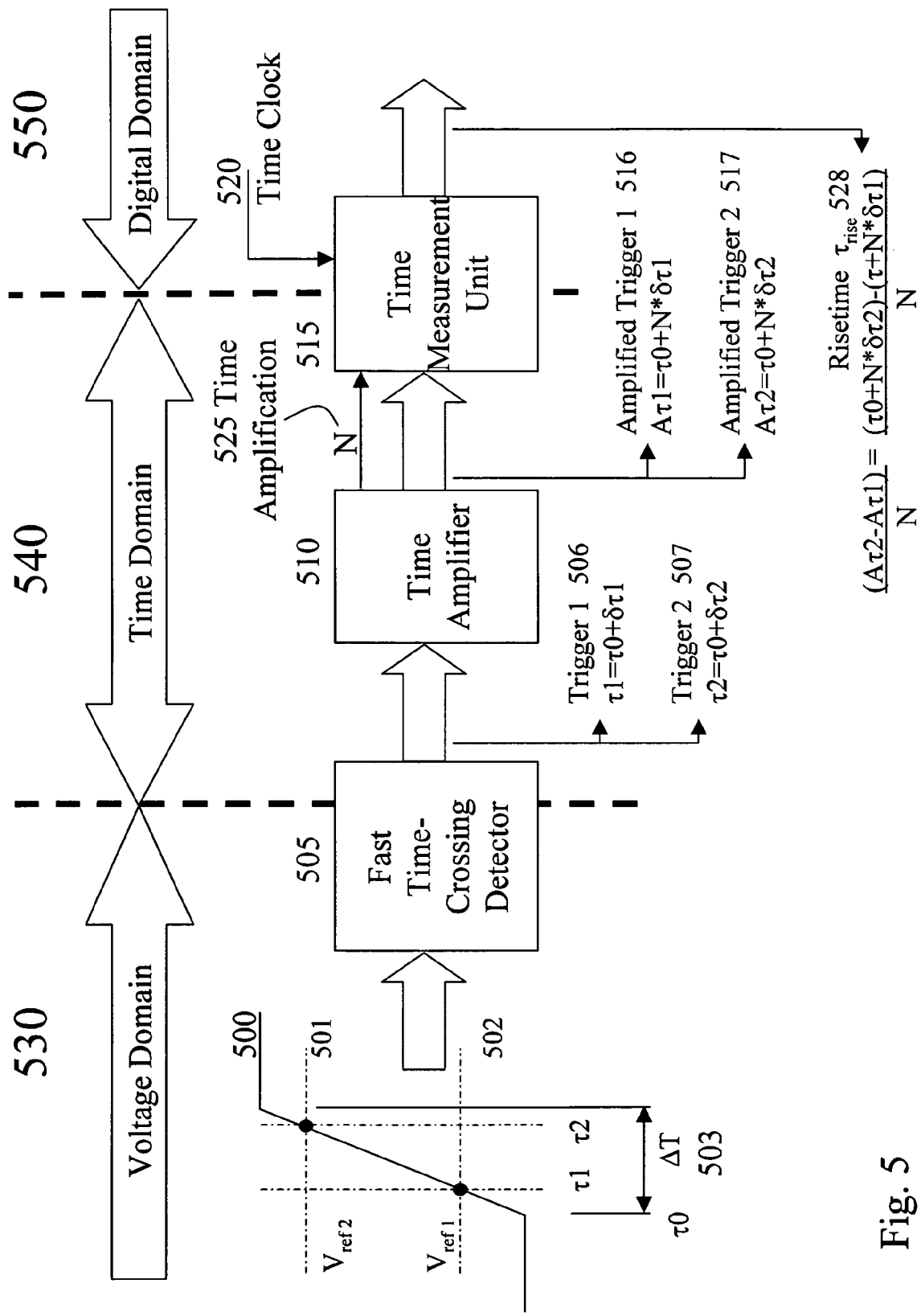
FIG. 5 illustrates schematically the invention for on-chip high-speed time domain characterization of electrical signals.

Referring to FIG. 5, an on-chip high-speed time domain analyzer is shown that offers a means to reducing the need for providing ultra-fast clocks. Shown is a voltage waveform 500, which is to be measured, and is measured using asynchronous sampling. In this illustrative example, the voltage waveform is considered digital with predetermined levels and the issue is measuring the 10%-90% rise time of the signal. As such two voltage references are established, these being the 10% reference voltage Vref1 502 and the 90% reference voltage Vref2 501. This voltage waveform 500 and the two reference voltages Vref1 502 and Vref2 501 are provided to a fast time-crossing detector 505. The fast time crossing detector 505, therefore, generates two time based events, Trigger 1 506 occurring at time $\tau 1 = \tau 0 + \delta \tau 1$, from when the voltage waveform crosses the 10% reference voltage Vref1 502, and Trigger 2 507 occurring at $\tau 2 = \tau 0 + \delta \tau 2$, from when the voltage waveform crosses the 90% reference voltage Vref2 501.

Figure 6:
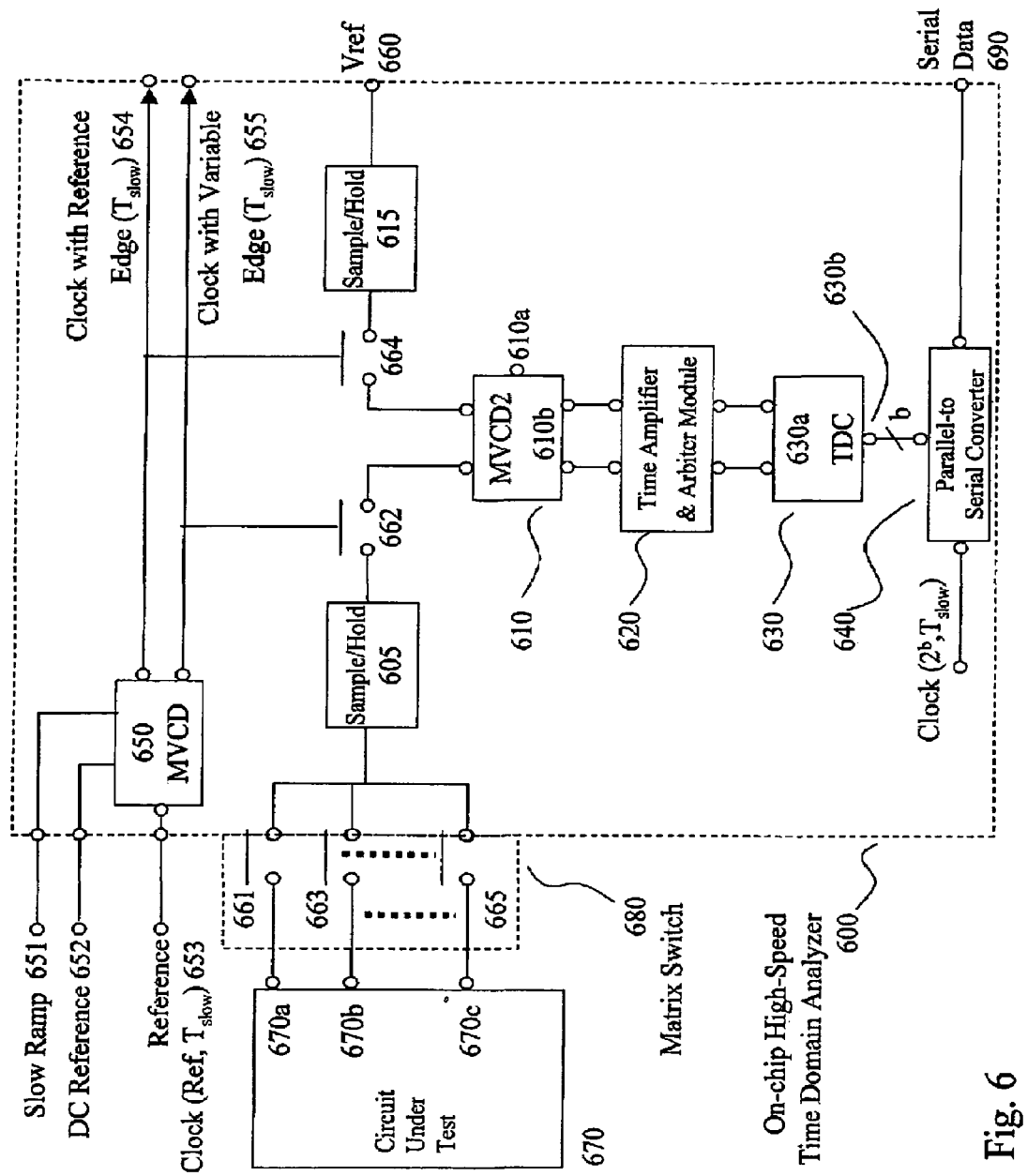
FIG. 6 illustrates a first embodiment of the invention for on-chip high-speed time domain characterization of electrical signals.

These two trigger signals Vref1 502 and Vref2 501 are then coupled into a time amplifier module 510, which in this illustrative example is intended to amplify the time base of a signal, the amplification being a factor N. As such the first output signal Trigger 1 506 is time amplified into Amplified Trigger 1 516 ($A\tau 1 = \tau 0 + N^* \delta \tau 1$), and the second output signal Trigger 2 507 is time amplified into Amplified Trigger 2 517 ($A\tau 2 = \tau 0 + N^* \delta \tau 2$). These time amplified trigger signals are then coupled out of the time amplifier module 510 and into the time measurement module 515. Within the time measurement module 515 the Amplified Trigger 1 56 and Amplified Trigger 2 517, respectively, are measured against the Time Clock 520, which establishes time measurements for the Amplified Trigger 1 56 and Amplified Trigger 2 517. In the illustrative embodiment shown, the time measurement unit 515 is pre-programmed to establish as its output signal the rise time result τrise 528. As such knowing the Time Amplification N 525, the time measurement unit 515 performs mathematical operations to present the rise time τrise 528. It would be evident to one skilled in the art that alternate embodiments are possible, including but not limited to providing a plurality of voltage references and providing simply the measured time values from the time measurement unit. Alternatively it is possible to provide for dynamic adjustment of the time amplifier according to time accuracy/resolution required, length of waveform being sampled, number of voltage waveforms, estimate of rise time from prior measurements, etc. Now referring to FIG. 6, illustrated is a first representative embodiment of the invention for an on-chip high-speed time domain analyzer 600. Shown externally to the on-chip high-speed time domain analyzer 600 is a circuit under test (CUT) 670, which forms part of the same overall semiconductor die as the on-chip high-speed time domain analyzer 600 but is not shown for clarity. The CUT 670 has a plurality of monitoring points 670a through 670c distributed therein for providing monitoring signals to the on-chip high-speed time domain analyzer 600. In the following representative embodiments sample and hold circuits are described and depicted with gating elements thereby providing a synchronous analyzer embodiment to the invention. Alternatively, an asynchronous analyzer embodiment is possible with the removal of these gating circuits and optionally the sample and hold circuits. Whilst such embodiments are not described subsequent synchronous and asynchronous embodiments are alternatives in each representative embodiment described.

Other circuit connections to the on-chip high-speed time domain analyzer 600 are voltage reference port Vref 660, slow ramp voltage port 651, DC voltage reference port 652, reference clock port 653, and serial data output 690. As the on-chip high-speed time domain analyzer 600 may in fact be one of multiple on-chip high-speed time domain analyzers, two output ports of the on-chip high-speed time domain analyzer 600 are shown, being a first clock output port 654 which has present a first clock signal at the clock rate of the reference clock (Tslow) with fixed reference edge, and a second clock output port 655 which provides a second clock signal, again at the same reference clock rate (Tslow) but with a variable edge. The first clock signal and second clock signal being generated by a first master voltage-controlled delay (MVCD) 650 of two master voltage-controlled delay (MVCD) cells within the on-chip high-speed time domain analyzer 600, the other being MVCD2 referred to in the figure by identity 610. The first MVCD 650 generates the first clock signal with reference edge and second clock signal with variable edge based upon the signals received from the slow ramp voltage port 651, DC voltage reference port 652 and the reference clock port 653. In this representative embodiment, the reference clock port 653 receives a clock signal at rate Tslow.

Operation of the MVCD 650 for clock generation is outlined subsequently with reference to FIGS. 7A and 7B. As will be presented in FIG. 7B two voltage-controlled delay (VCD) cells are employed providing the reference and variable edge signals, although alternative configurations may be employed, such a employing pairs of VCD cells to provide a differential VCD function for each signal, also known as master-slave voltage controlled delay generators. The second clock signal with reference edge is coupled to a second switch gate 664 such that it periodically connects a signal present at output port of the second sample-and-hold circuit 615, which is coupled to the voltage reference port Vref 660, to one input port of a signal capture MVCD (MVCD2) 610. The first clock signal with reference edge is coupled to a first switch gate 662 such that it periodically connects a signal present on the output port of a first sample-and-hold circuit 605 to another input port of the second signal capture MVCD2 610. The first sample-and-hold circuit 605 is coupled to a matrix switch

680, comprising switches 661, 663, and 665, for selecting one of monitoring points 670a through 670c of the CUT 670 to analyze/characterize.

The signal capture MVCD2 610 is periodically coupled to the first sample-and-hold circuit 605 and second sample-and-hold circuit 615, and further receives at port 610a a trigger signal from the reference clock. The output signals provided by the signal capture MVCD2 610 are time points for the sample-and-held waveform under analysis crossing relative to the reference voltage Vref applied at the reference voltage port 660. These output signals are provided from MCVD2 output ports 610b and are coupled to a time amplifier and arbiter module 620 which takes the $i^{th}$ trigger event occurring at $\Delta t_{out,i}$ from the signal capture MVCD2 610, amplifies the time base, and then couples this signal from the time amplifier and arbiter module 620 to a time-data converter module (TDC) 630. The output signal, $\Delta t_{out,amplified}$, is time base expanded by the expansion factor established by at least one of design or programming criteria for the time amplifier and arbiter module 620.

The arbiter section of the time amplifier and arbiter module 620, which is not shown separately, provides start and stop signals which are presented to the TDC module 630. The TDC module 630 receives the start and stop signals from the preceding time amplifier and arbiter module 620 at the input port 630a, and performs a flash $2^B$-bit conversion before presenting the $2^B$ bits on an output bus 630b for coupling to a parallel-serial converter 640.

The parallel-serial converter 640 receives a clock signal scaled by $2^B$ and presents serial digital data at serial data port 690. The bit location within this serial digital data stream where the logic levels changes from logic 0 to logic 1 represents the time difference between the input signals to the TDC 630, being the start and stop signals (or edges) received from time amplifier and arbiter module 620.

Alternative embodiments of the invention are possible including but not limited to directly converting the serial digital data stream to a digital word representation and dynamically adjusting the number of bits B, and providing a control allowing the delay for each MVCD to be varied.

Figure 7A:
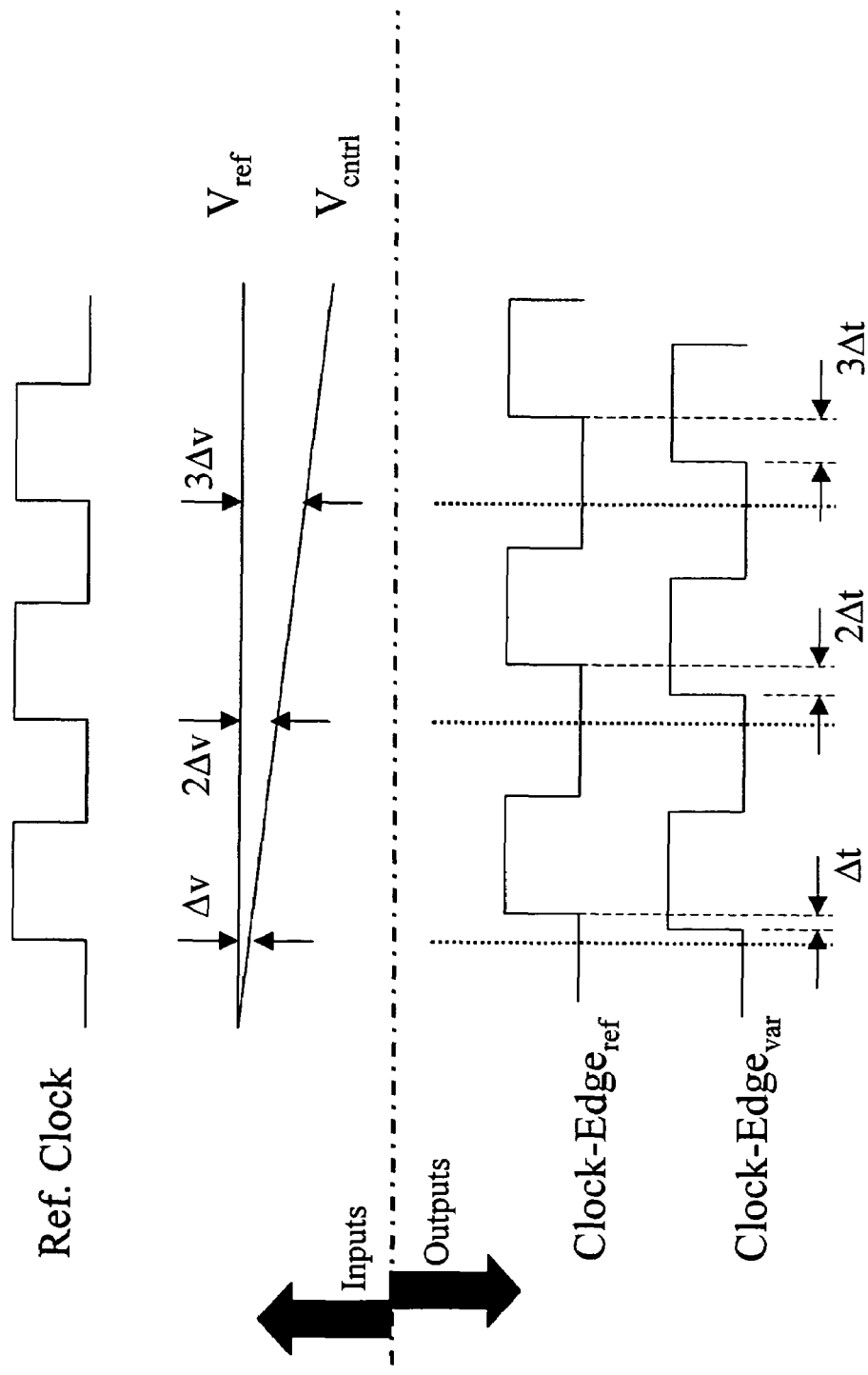
FIG. 7A illustrates schematically the multiple clock signal generation and their respective timing.

Now referring to FIG. 7A, illustrated schematically is the operating principle of generating multiple clock signals employed within the representative embodiment of the on-chip high-speed time domain analyzer 600. The principle relates to the first MVCD 650. Shown uppermost are the input signals to the first MVCD 650, these being the reference clock as applied to the reference clock port 653, the reference voltage Vref applied at the DC voltage reference port 652, and the control voltage Vcntrl applied at the slow ramp voltage port 651. As shown, the control voltage Vcntrl is a linear ramp and the reference voltage Vref is a fixed level but it would be evident to one skilled in the art that alternative embodiments of the ramp and reference voltage patterns are possible including but limited to a staircase waveform generated by a digital-to-analog converter and the output of an oscillator.

Shown lowermost are the output signals of the first MVCD 650, being a first clock with reference edges (Clock-Edge$_{ref}$) and a second clock with variable edge positions (Clock-Edge$_{var}$). The first clock is offset from the reference clock by a constant time interval, the time interval being proportional to the reference voltage Vref applied. The second clock is offset from the reference clock similarly in proportion to the control voltage Vcntrl, which since it is a ramping control voltage results in the edges of the second clock differing for each clock cycle thereby giving the variable edge to the clock signal. As outlined in reference to FIG. 7A the edge of the signals employed is the rising edge, alternatively the falling edges of the reference clock, first clock with reference edges (Clock-Edge$_{ref}$) and the second clock with variable edge positions (Clock-Edge$_{var}$) respectively can be employed to provide the same functionality.

Figure 7B:
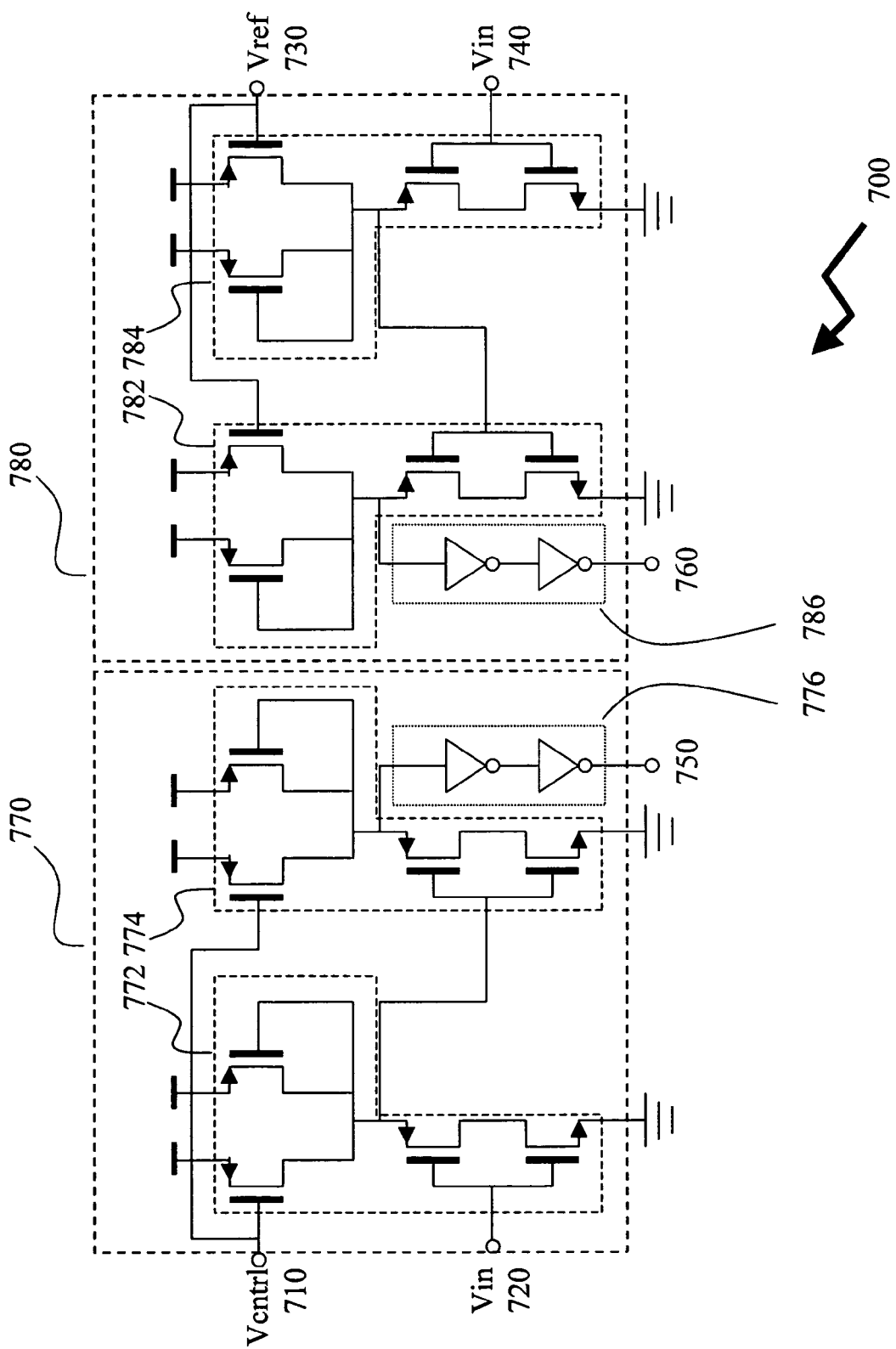
FIG. 7B illustrates an representative circuit for generating the clocks required according to the first embodiment of the invention and according to the approach outlined in FIG. 7A.

FIG. 7B illustrates an representative clock generating circuit 700, being the first MVCD 650 in FIG. 6, for generating the clock signals according to the first embodiment of the invention and according to the signal generation approach outlined in FIG. 7A. As such the clock generating circuit 700 comprises two identical clock cells 770 and 780. Alternatively, clock cells are similar but not identical or dissimilar. Each clock cell 770 and 780 has two input ports and one output port. The transistor configurations are based upon cascading two voltage-controlled delay elements implemented in a current starved topology. As such the first clock cell 770 comprises a first VCD-cascade circuit 772 having Vin 720 and Vcntrl 710 input ports. An output port of this is coupled to the second VCD-cascade circuit 774. The second voltage for the second-VCD cascade circuit 774 is the voltage applied at the Vcntrl 710 port. First buffer circuit 776, prior to being coupled to the output port 750, buffers the output signal of the second VCD cascade circuit 774.

Second clock cell 780 comprises a third VCD cascade circuit 784 having Vin 740 and Vref 730 input ports. An output port of this is coupled to the fourth VCD cascade circuit 782. The second voltage for the fourth-VCD cascade circuit 782 is the voltage applied at the Vref 730 port. Second buffer circuit 786, prior to being coupled to the output port 760, buffers the output signal of the fourth VCD cascade circuit 782.

Thus the cascaded voltage controlled delay circuits provide switching characteristics in respect of the threshold crossing between the reference clock, applied to the Vin ports 720 and 740 and the threshold set voltage applied to the other input ports, namely Vcntrl 710 and Vref 730. In this manner the first clock cell 770 receives the reference clock at Vin port 720 and the control voltage Vcntrl at port 710, and generates the first clock signal Clock-Edge$_{ref}$ which is coupled to the output port 750. Likewise, the second clock cell 780 receives the reference clock at Vin port 720 and the control voltage Vcntrl at port 710, and generates the second clock signal Clock-Edge$_{var}$ that is coupled to the output port 760. It will be evident to one skilled in the art that other processes for generating the two clocks are possible without departing from the scope of the invention.

Whilst the representative clock generating circuit 700 shown in FIG. 7B employs two clock cells 770 and 780, the first clock cell 770 for providing the first clock signal Clock-Edge$_{ref}$ and the second clock cell 780 for providing the second clock signal Clock-Edge$_{var}$ it would be evident that alternatively each of the clock cells 770 and 780 can be replicated and cascaded such that each of the first clock signal Clock-Edge$_{ref}$ and second clock signal Clock-Edge$_{var}$ are outputs from a pair of clock cells respectively. Further, whilst the representative embodiments present a single value of incremental delay $\Delta t$ alternative implementations could be implemented providing for a variation in the incremental delay $\Delta t$ in response to external control settings, such as a controller for the on-chip high-speed time domain analyzer 600 or a variation in response to a first pass measurement indicating a variation in delay $\Delta t$ is appropriate.

Figure 8A:
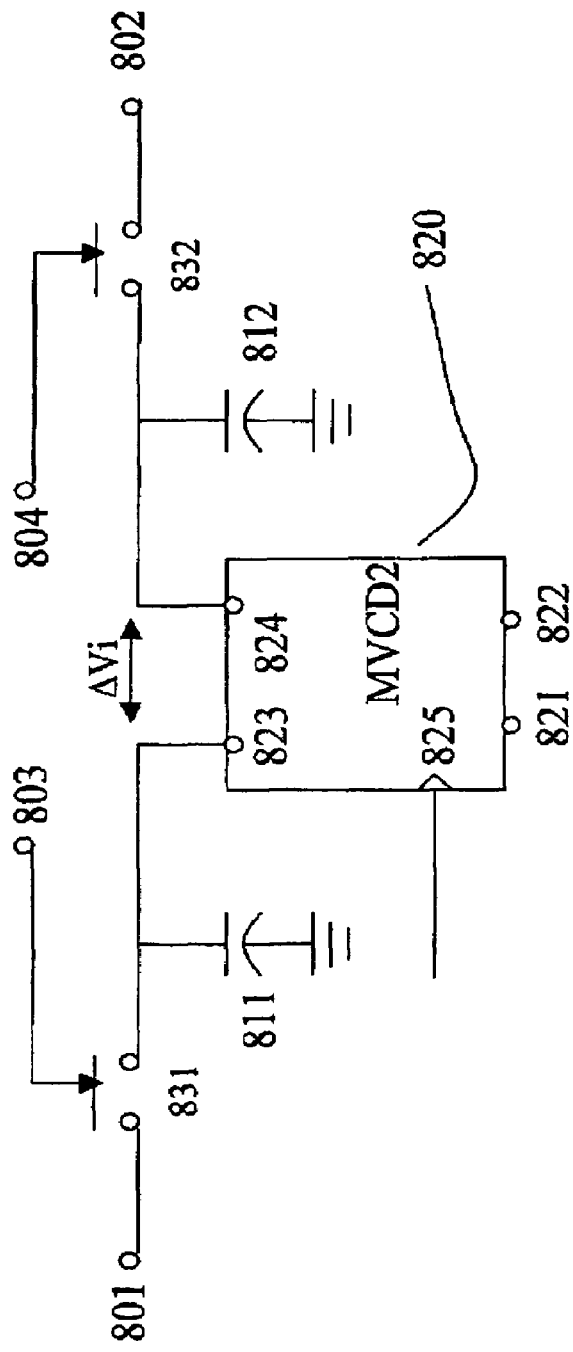
FIG. 8A illustrates schematically a voltage to time converter providing voltage-to-time conversion according to the first embodiment of the invention.

FIG. 8A illustrates schematically a fast voltage to time converter providing the required voltage-to-time conversion. Shown is a section of the on-chip high-speed time domain analyzer 600 previously described. The second MVCD2 820 (element 610 in FIG. 6) receives three voltage input signals at ports 823, 824, and 825 and provides two output time signals at ports 821 and 822. Port 823 is coupled to a first switching circuit 831 that toggles on/off the voltage present at port 801, and is filtered via first coupling capacitor 811. Similarly port 824 is coupled to a second switching circuit 832 which toggles on/off the voltage present at port 802, and is similarly filtered via second coupling capacitor 812.

Additionally, a first gating signal is provided to a first gate port 803, thereby controlling the first switching circuit 831. A second gating signal is provided to a second gate port 804, thereby controlling the second switching circuit 832. Also coupled to the second MVCD2 820 is a trigger signal, which is applied at port 825 and is either directly or indirectly the reference clock applied to the on-chip time domain high-speed analyzer 600 at clock port 653.

Figure 8B:
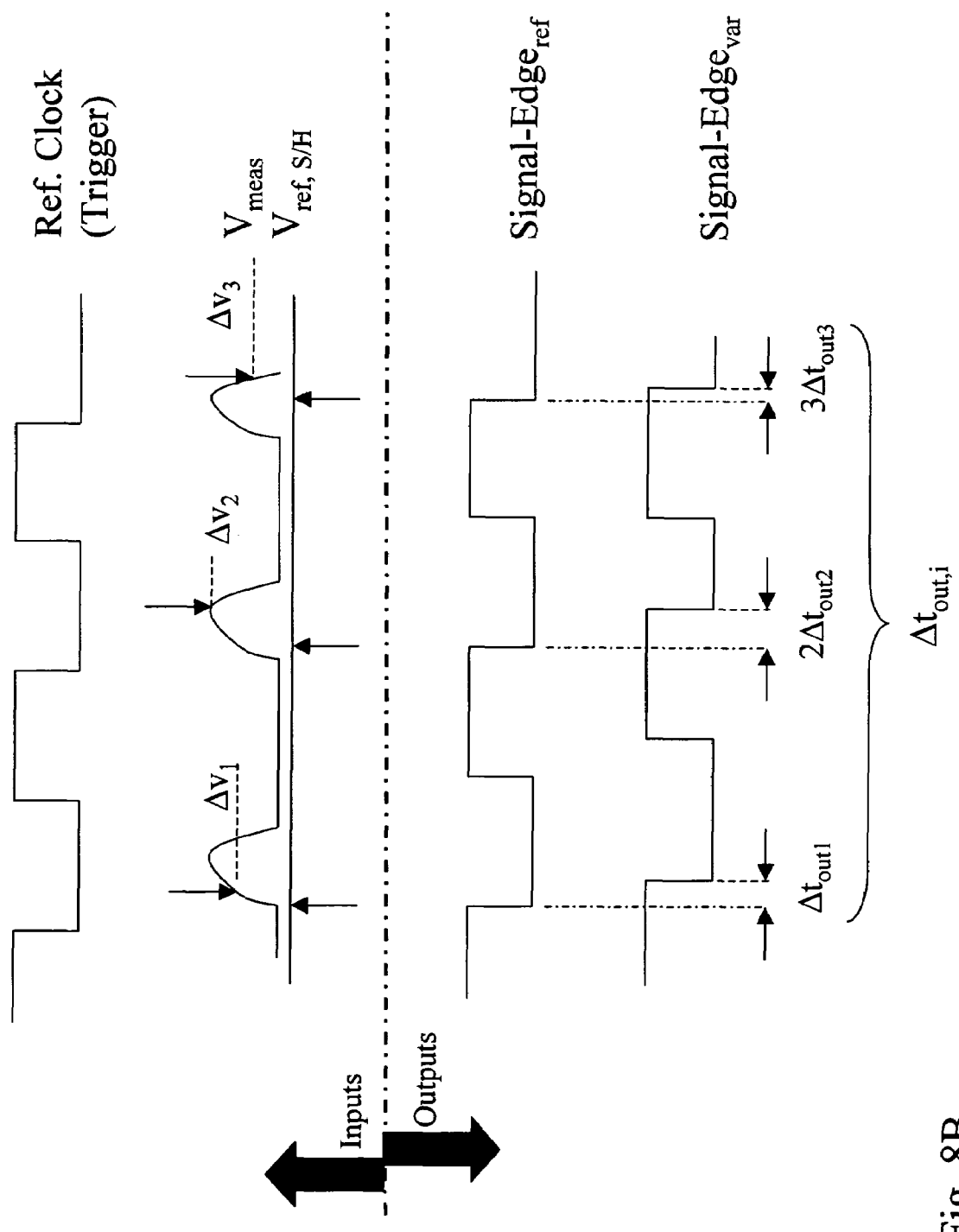
FIG. 8B illustrates schematically the signals and timing within the voltage to time converter of FIG. 8A.

Referring to FIG. 8B, the relationship between these input signals and reference clock timing is illustrated with respect to generating time signals within the voltage to time converter of FIG. 8A. Shown uppermost are the input signals, first being the reference clock applied as the trigger to port 825. Shown next is the Vmeas signal, which is provided to the second MVCD2 820 from port 801, being the sample-and-hold signal from the first sample-and-hold-circuit 605. This is gated through to the second MVCD2 820 by the first switching circuit 831.

Also shown is the Vref signal that is provided to the second MVCD2 820 from port 802, being the sample-and-hold signal from the second sample-and-hold-circuit 615. This is gated through to the second MVCD2 820 by the second switching circuit 832. The second MVCD2 circuit therefore generates two output signals. The first, Signal-Edge$_{ref}$ is determined such that its edges are offset from those of the reference clock signal in proportion to the Vref signal. The second, Signal-Edge$_{var}$ is determined such that the edges of this signal are offset relative to the reference clock signal by an amount proportional to the Vmeas signal. The result is two digital signals where the offset between the edges of the two signals is proportional to the voltage difference between Vref and Vmeas, namely ΔVi between input ports 823 and 824

It would therefore be evident to one skilled in the art that MVCD2 820 (MVCD2 610 of FIG. 6) is implementable using the same circuit topology employed for MCVD 650 of FIG. 6, as illustrated in FIG. 7B. Further, as presented supra two voltage-controlled delay (VCD) cells are employed in providing each signal, alternative configurations may be employed, such a employing pairs of VCD cells to provide a differential VCD function for each signal, also known as master-slave voltage controlled delay generators.

Alternatively other circuit implementations are possible without affecting the scope of the invention. Further, whilst as outlined in reference to FIG. 8B the edge of the signals employed is the falling edge it would be evident that alternatively the rising edges of the reference clock, first signal with reference edges (Signal-Edge$_{ref}$) and the second signal with variable edge positions (Signal-Edge$_{var}$) respectively can be employed to provide the same functionality.

Figure 9A:
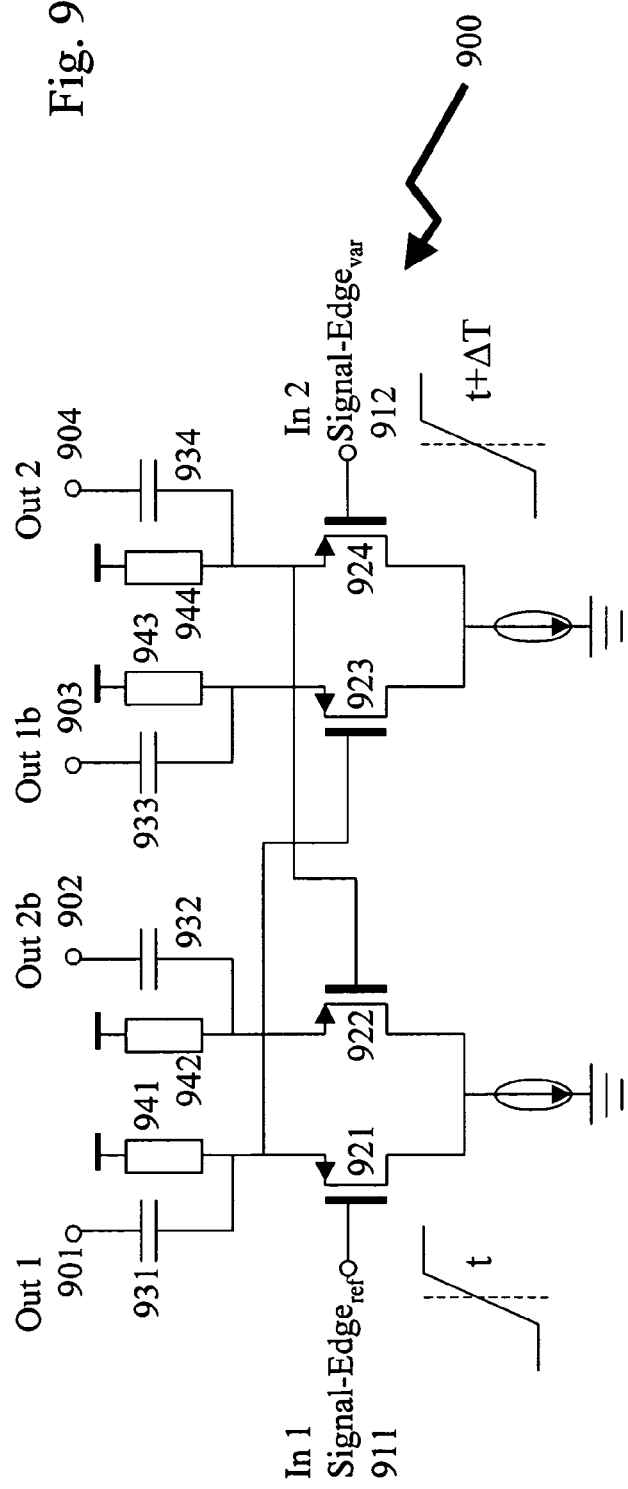
FIG. 9A illustrates an representative circuit for providing a time amplifier providing the expansion of time according to the first embodiment of the invention.
Figure 9C:
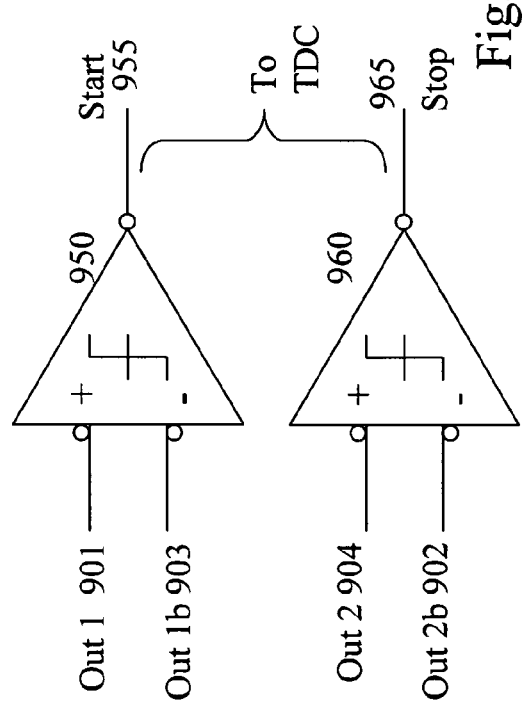
FIG. 9C illustrates schematically a circuit converting the output signals of the representative time amplifier circuit in FIG. 9A into signals for the time measurement unit according to the first embodiment of the invention in FIG. 6.

Referring to FIG. 9A, there is illustrated an representative circuit for providing a time amplifier 900 providing the expansion of time function within the on-chip time domain analyzer 600 of the representative embodiment of FIG. 6. As such the time amplifier forms part of the time amplifier and arbiter 620 of FIG. 6. The time amplifier 900 comprises four transistors 921 through 924 coupled with two input ports, In1 911 comprising a first edge of a measurement and obtained from the Signal-Edge$_{ref}$ as outlined in FIG. 8B, and In2 912 comprising a second edge of the measurement and obtained from the Signal-Edge$_{var}$ as outlined in FIG. 8B. The time amplifier also comprises four capacitors 931 through 934 and four resistors 941 through 944. The signal edges coupled through the transistors 921 through 924 result in charging and discharging of the capacitor/resistor pairs and generate four output signals Out1 901, Out1$b$ 903, Out2 904 and Out2$b$ 902.

The time amplification results from this discharging/charging of the output nodes being determined by the time constants of the sections and therefore controlled by the values of the respective resistor and capacitor elements in each of the output nodes 901 through 904 together with differential transistor pairings and biasing. This results in each of the two input signal edges, Signal-Edge$_{ref}$ and Signal-Edge$_{var}$ generating two output signals to provide four output signals, Out1 901, Out1$b$ 903. Out2 902, and Out2$b$ 904. As shown, the Out1 901 signal provided at port 901 is driven from the In 1 Signal-Edge$_{ref}$ 911, and has a time constant determined by the Out1 capacitor 931 and Out1 resistor 941. The Out1$b$ signal at port 903 being similarly driven by the In 1 Signal-Edge$_{ref}$ 911 but has a time constant determined by the Out1 $b$ capacitor 933 and Out1$b$ resistor 943.

The In 2 Signal-Edge$_{var}$ 912 drives the Out2 signal at port 904, this signal having a time constant determined by the Out2 capacitor 934 and Out2 resistor 944. It also drives the Out2$b$ signal at port 902, this signal having a time constant determined by the Out2$b$ capacitor 932 and Out2$b$ resistor 942.

By setting the values of the Out2 capacitor 934 and Out2 resistor 944 to the same values as the Out2$b$ capacitor 933 and Out2$b$ resistor 943 respectfully, and the Out1$b$ capacitor 932 and Out1 resistor 942 to the same values as the Out1 capacitor 931 and Out1 resistor 941 respectfully each of In 1 Signal-Edge$_{ref}$ and In 2 Signal-Edge$_{var}$ generates a pair of output signals. The first pair driven by In 1 Signal-Edge$_{ref}$ being provided as Out1 at port 901 and Out1$b$ at port 903, and second pair driven by In 2 Signal-Edge$_{var}$ as Out2 at port 904 and Out2$b$ at port 902.

From the configurations of the transistors 921 and 923 with respect to the In1 Signal-Edge$_{ref}$ signal at port 901 is a positive transition with a first time constant $\tau_1$ and the signal at port 903 is a negative transition with the same first time constant $\tau_1$, as C (Out1$b$ capacitor 933)=C (Out1 capacitor 931) and R (Out1$b$ resistor 943)=R (Out1 resistor 933). Similarly, the configurations of the transistors 922 and 924 with respect to the In2 Signal-Edge$_{var}$ signal at port 904 is a positive transition with a first time constant $\tau_2$ and the signal at port 902 is a negative transition with the same first time constant $\tau_2$, as C (Out2$b$ capacitor 932)=C (Out2 capacitor 934) and R (Out2$b$ resistor 942)=R (Out2 resistor 932).

Figure 9B:
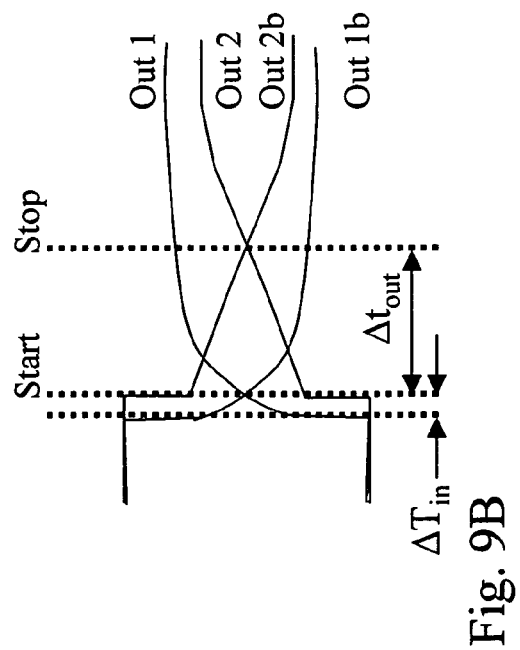
FIG. 9B illustrates the signals and timing of the output signals from the representative circuit of FIG. 9A.

Since In1 Signal-Edge$_{ref}$ occurs at time t, and the In2 Signal-Edge$_{var}$ occurs at time t+Δt, the ratio of these time constants, N, being $\tau_2/\tau_1$ provides a scaling of the Δt, the difference in timebase of the input signals. Hence where $\tau_2 > \tau_1$ this difference Δt timebase is expanded by the factor N, and where $\tau_2/\tau_1$ this Δt is compressed by the factor N. This is illustrated in FIG. 9B.

Whilst, embodiments of the invention as described in respect of FIGS. 5 through 12B address embodiments of time amplification, or expansion by setting $\tau_2 > \tau_1$, it will be appreciated that there are instances wherein the timing between events is large and difficult to handle effectively with conventional instrumentation. In these instances, compression of the timebase provides benefit, and is achieved by setting $\tau_2 < \tau_1$. Further, whilst the embodiments are described in respect of fixed amplification, N, the provision of a tunable component to the resistors, capacitors or both within the Out2 and Out 2$b$ paths provides the ability to vary the amplification of the system.

The four output signals of the time amplifier 900, Out1 901, Out1b 903, Out2 904 and Out2b 902, are coupled to the arbiter section of the time amplifier and arbiter 620 of FIG. 6. This is illustrated schematically in FIG. 9C which describes converting these output signals of the representative time amplifier circuit in FIG. 9A into signals for the time measurement unit according to the embodiment of FIG. 5. As shown the four signals Out1 901, Out1b 903, Out2 904 and Out2b 902 are fed to two arbiters 950 and 960. The first arbiter 950 receives signals Out1 901 and Out1b 903 and provides Start 955 as an output signal therefrom. The second arbiter 960 receives signals Out2 904 and Out2b 902 and provides Stop 965 as an output signal therefrom.

Figure 9D:
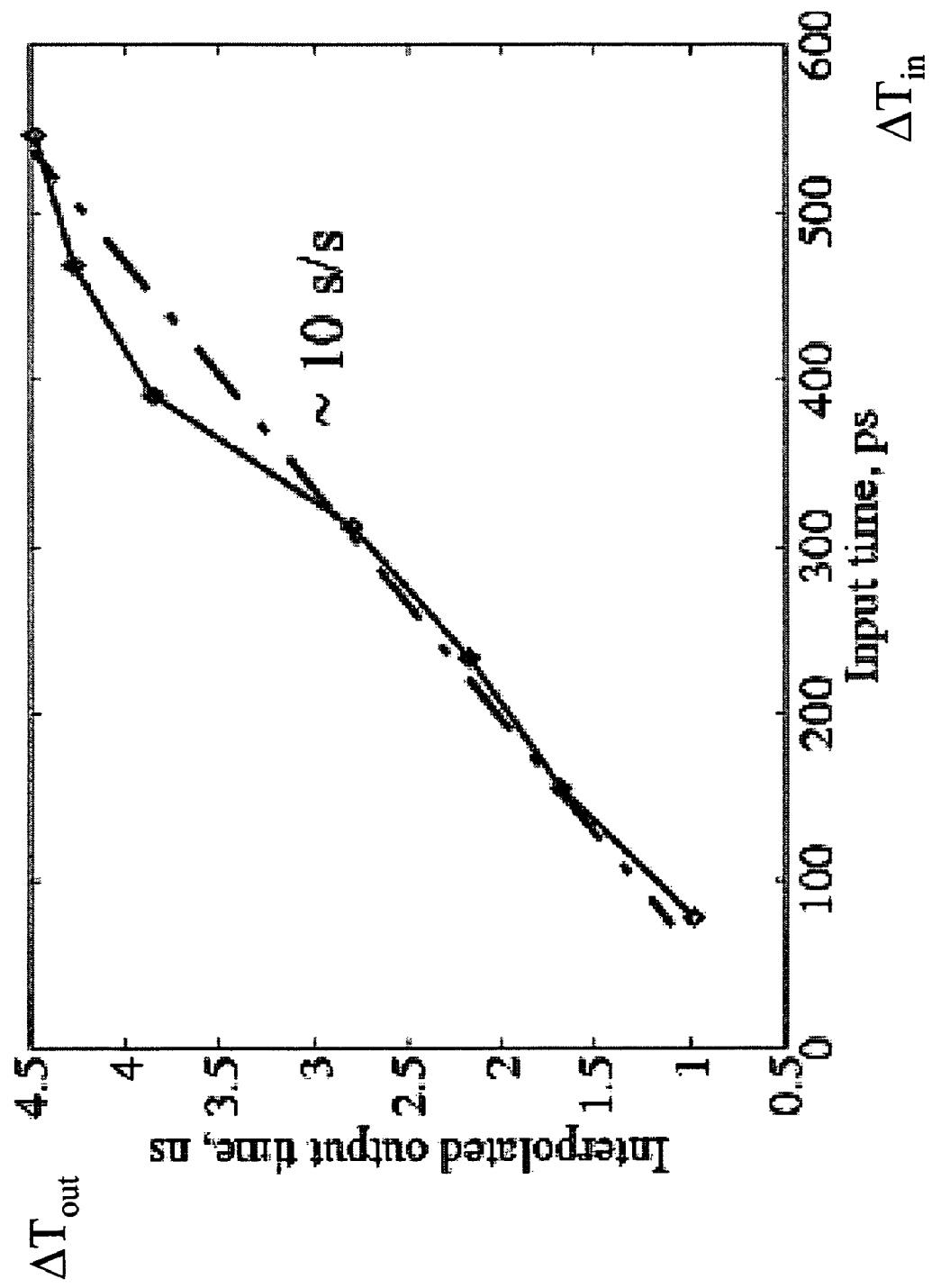
FIG. 9D illustrates experimental results for a time amplifier measuring the rise time of an electrical signal.

FIG. 9D illustrates experimental results for a time amplifier measuring the rise time of an electrical signal using thresholds set at 0.5V and 1.3V, wherein the time amplifier is set with an amplification 7.5 s/s. It would be evident to one skilled in the art that other amplifications are possible according to the application and requirements of accuracy and resolution. Alternatively it would be evident that provision of tunable reactance elements would allow the time amplifier to be adjusted/set by an additional control signal.

Figure 10:
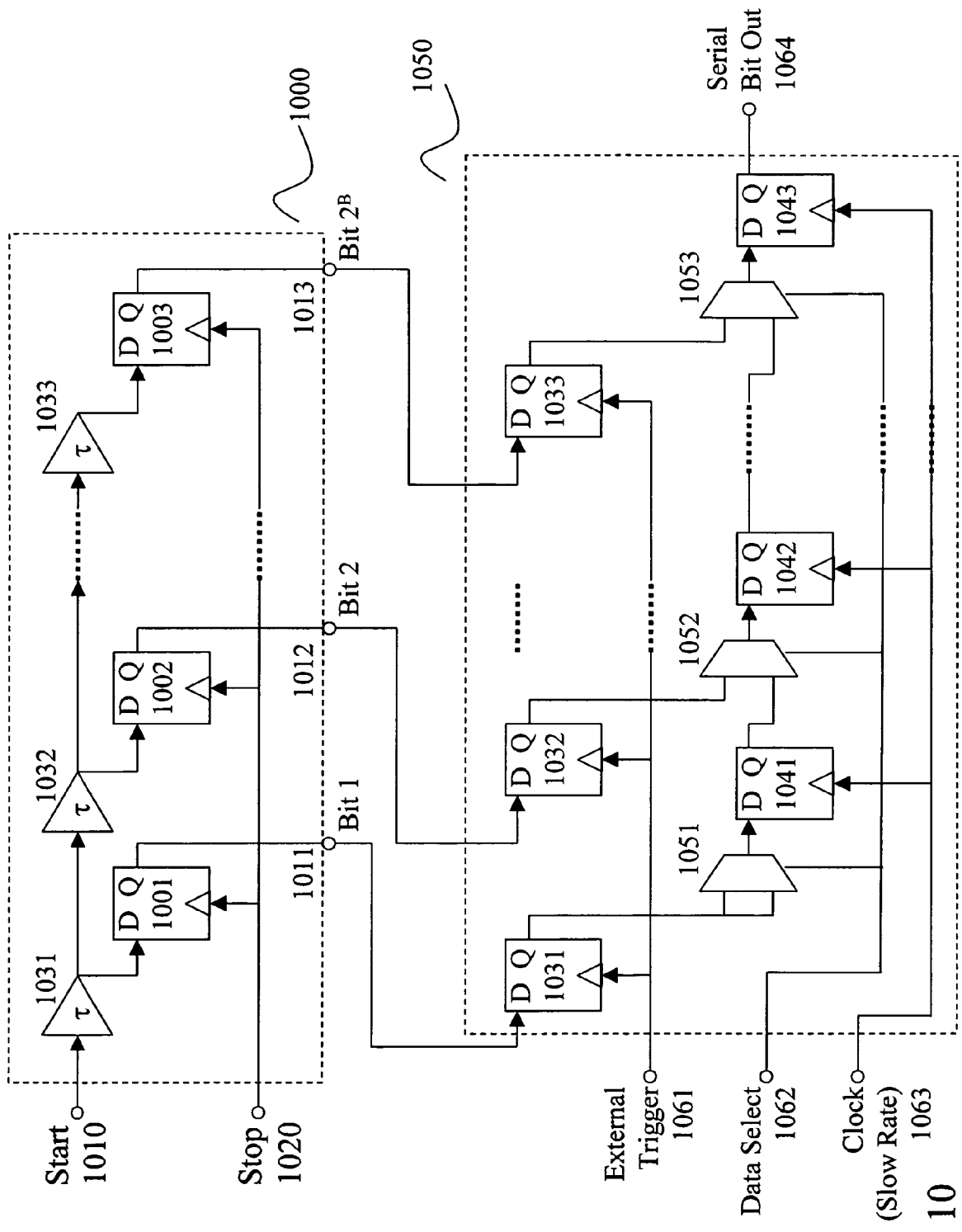
FIG. 10 illustrates an representative circuit for providing the time to data conversion and parallel-to-serial conversion functions within the time measurement unit according to the first embodiment of the invention in FIG. 5.

Now referring to FIG. 10 there are shown representative circuits for providing the TDC 630 and Parallel-to-Serial Converter 640 as shown in FIG. 6. The TDC 630 is shown in FIG. 10 as a Flash TDC 1000 comprising a chain of buffer delays 1031 through 1033, and D-type flip-flops (DFFs) 1001 through 1003. The input signal to the chain of buffer delays 1031 through 1033 is the Start Signal 1010 from the arbiter 620 (Start 955 of FIG. 9C). The output signal from each buffer delay 1031 through 1033 is fed to one of the DFFs 1001 through 1003. The clock for each of the DFFs 1001 through 1003 is the Stop Signal 1020 (Stop 965 of FIG. 9C). The output signals from the DFFs are coupled out as bits of the parallel bit stream, the first bit 1011 coming from the first DFF 1001, bit 2 1012 coming from the second DFF 1002, and the Bit 2B 1013 coming from the final DFF 1003.

Each of the bits 1011 through 1013 are coupled from the Flash TDC 1000 to the Parallel-to-Serial Converter (PSC) 1050. Other signals to the PSC 1050 are an external trigger signal applied to the trigger port 1061, a data select signal applied to the data select port 1062, and a shift-out clock signal applied to the clock port 1063. Each bit of the parallel bit array 1011 through 1013 from the Flash TDC 1000 is coupled to an individual DFF in the first row of DFFs 1031 through 1033, these being clocked using the external trigger signal coupled from the trigger port 1061.

The output signals from the first row of DFFs 1031 through 1033 are coupled to an array of OR gates 1051 through 1053, which are gated by the data select signal coupled from the data select port 1062. The output signals from the OR gates 1051 through 1053 are then coupled to the second row of DFFs 1041 through 1043. As a result of the sequence of DFFs, an external trigger signal 1061, a data select signal 1062 and a clock signal 1063, the bits 1011 through 1013 are converted from their parallel format to the serial bit stream coupled to the serial data out port 1064.

Figure 11:
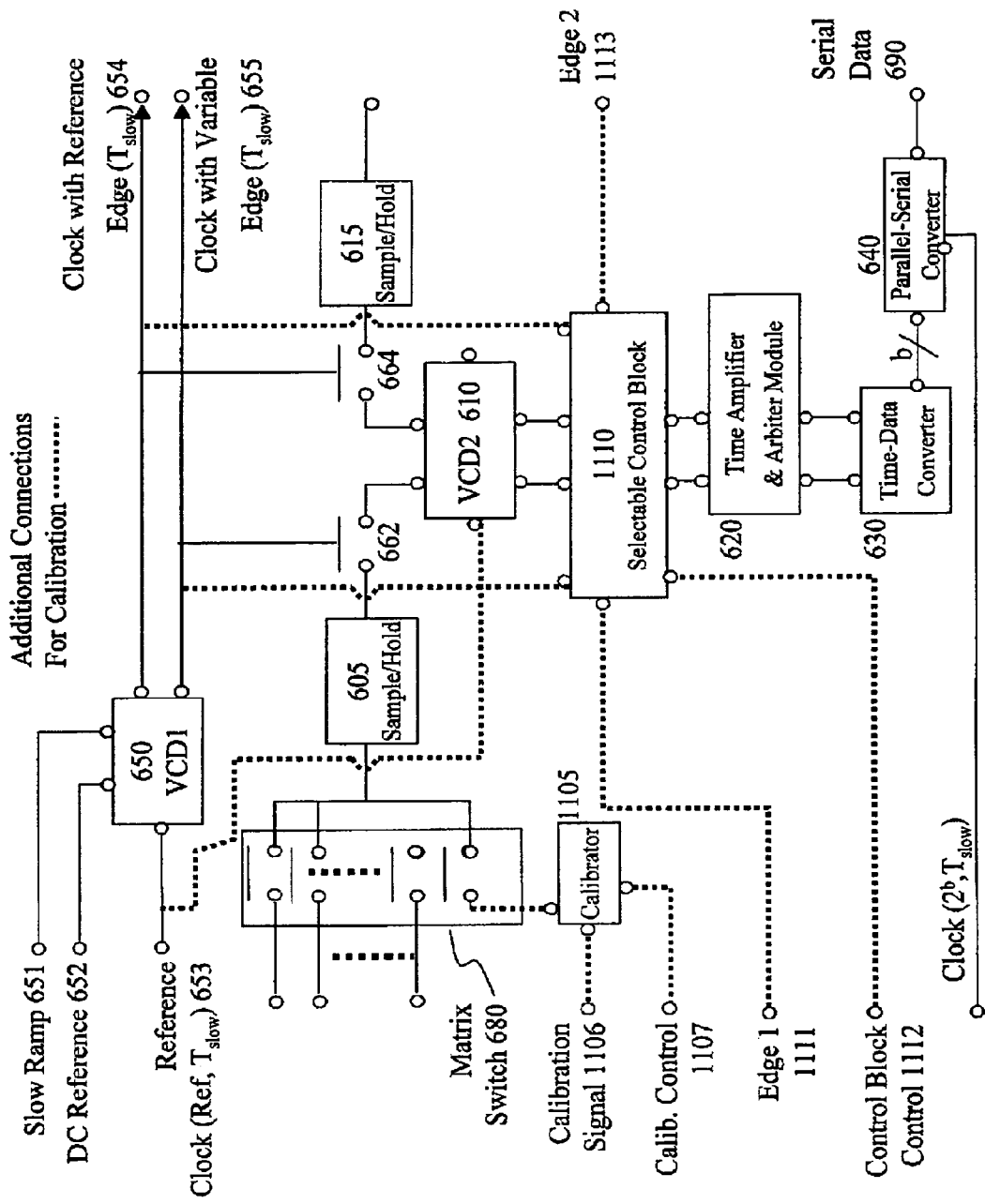
FIG. 11 shows a second embodiment of the invention schematically, wherein additional calibration elements have been implemented into the first embodiment of FIG. 6.

Referring to FIG. 11 shown is a modification to the first embodiment outlined in FIG. 6, presenting a calibration approach for the on-chip high-speed time domain measurement system. FIG. 11 therefore shows the first embodiment schematically with the additional calibration elements. For simplicity only the main blocks are referenced and identified. As such the representative embodiment with calibration includes the first MVCD 650, which receives the reference clock 653. However, the reference clock 653 is now coupled also to the second MVCD (MVCD2) 610 and provides the required trigger signal to MVCD2 610.

The output clock signals, first clock signal with reference edge 654 and second clock signal with variable edge 655 are still coupled to the first and second switch gates 662 and 664 but are now additionally coupled to a selectable control block 1110 disposed between the MVCD2 610 and time amplifier and arbiter module 620. First and second switch gates 662 and 664 are coupled to the first and second sample-and-hold circuits 605 and 615, respectively.

The first sample-and-hold circuit 605 remains coupled at it's other side to the matrix switch 680, allowing for the selective connection of one of the multiple monitoring points within the integrated circuit to the on-chip high speed time domain measurement system. The matrix switch 680 also provides a connection to a calibrator 1105, which receives two signals, a calibration signal from the calibration signal port 1106 and a calibration control signal from the calibration control port 1107. The selectable control block 1110 in addition to receiving the clock signals from VCD1 650 and the time signals from VCD2 610 also receives an Edge 1 signal from the Edge 1 port 1111, a delayed Edge 2 signal from the Edge 2 port 1113 and a control signal from the control block control port 112.

The representative calibration approach outlined schematically in FIG. 11, as applied to the first embodiment of the on-chip high-speed time domain analyzer 600 of FIG. 6 would be implemented in this representative example in three sequential steps. In the first step the path within the on-chip high-speed time domain analyzer 600 of the time amplifier and arbiter 620 and time-data converter 630 is calibrated. This is achieved by applying known signals with predetermined time difference to the time amplifier and arbiter module 620 through the selectable control block 1110. As shown they are external to the on-chip high-speed time domain analyzer 600 but the circuitry generating these signals may alternatively be integrated into the circuit or be elsewhere within the integrated circuit.

The signals consisting of predetermined time difference are then amplified, digitized and serially shifted out from the on-chip high-speed time domain analyzer 600 through this sub-section of the on-chip high-speed time domain analyzer 600. This allows the amplification of the time amplifier and arbiter module 620 to be established with the calibration including the time-data converter.

The second step involves calibrating the time interpolation scheme from VCD 1 650. Known DC voltages are applied to the slow ramp port 651 and DC reference port 652 and the resulting time difference recorded and is indirectly measured using the sequence of blocks already calibrated in step 1. This therefore constitutes the timing information needed for reconstructing the waveform to be diagnosed.

The final calibration step consists of applying known DC levels to the input port of the calibrator 1105 and measuring the digital signal that results, calibrating therefore the first sample-and-hold 605 and VCD2 610 sequence of blocks. This is achieved while relying on the information from step one (digital time amplification and conversion) and step two (timing information of VCD1). These steps conclude the calibration mode and the system is then set properly to turn the system into a full testing mode by provision of appropriate signals to the calibrator 1105 and selectable control block 1110. Advantageously and importantly this calibration scheme relies on the already existing blocks of the on-chip high-speed time-domain analyzer 600 of FIG. 6 and therefore minimizes the additional overhead on the integrated circuit and cost as minimal additional circuitry is added. Importantly, if the calibration is performed using external instrumentation rather than additional on-chip elements these instruments are low-end instruments and hence correspondingly low cost.

Now referring to FIG. 12 shown is a photomicrograph of a realized on-chip high speed time domain analyzer function in a CMOS IC 1200 according to the first embodiment outlined in FIG. 6. The silicon die shown incorporates in the regions and gates 1203, time amplifier 1204, capacitors 1205, digital logic 1206, arbiters 1207, sample-and-hold circuits 1208, time-to-data conversion and parallel-serial converter 1209, calibration circuits 1210, and VCD2 1211. As is evident from the photomicrograph of the CMOS IC 1200 no attempts to optimize layout have been made for this demonstration CMOS IC 1200, which consumes approximately 0.65 mm2 of silicon die and has power consumption below 10 mW. The demonstration CMOS IC 1200 was implemented in 0.18 um silicon and provided rise time measurements down to 50 ps, and providing for a 100 ps rise time a measurement error of 7 ps. Such measurement accuracy being comparable to time measurement errors in high end laboratory oscilloscopes costing over $25,000 in a silicon chip costing less than a dollar when integrated into a volume IC.

Figure 12A:
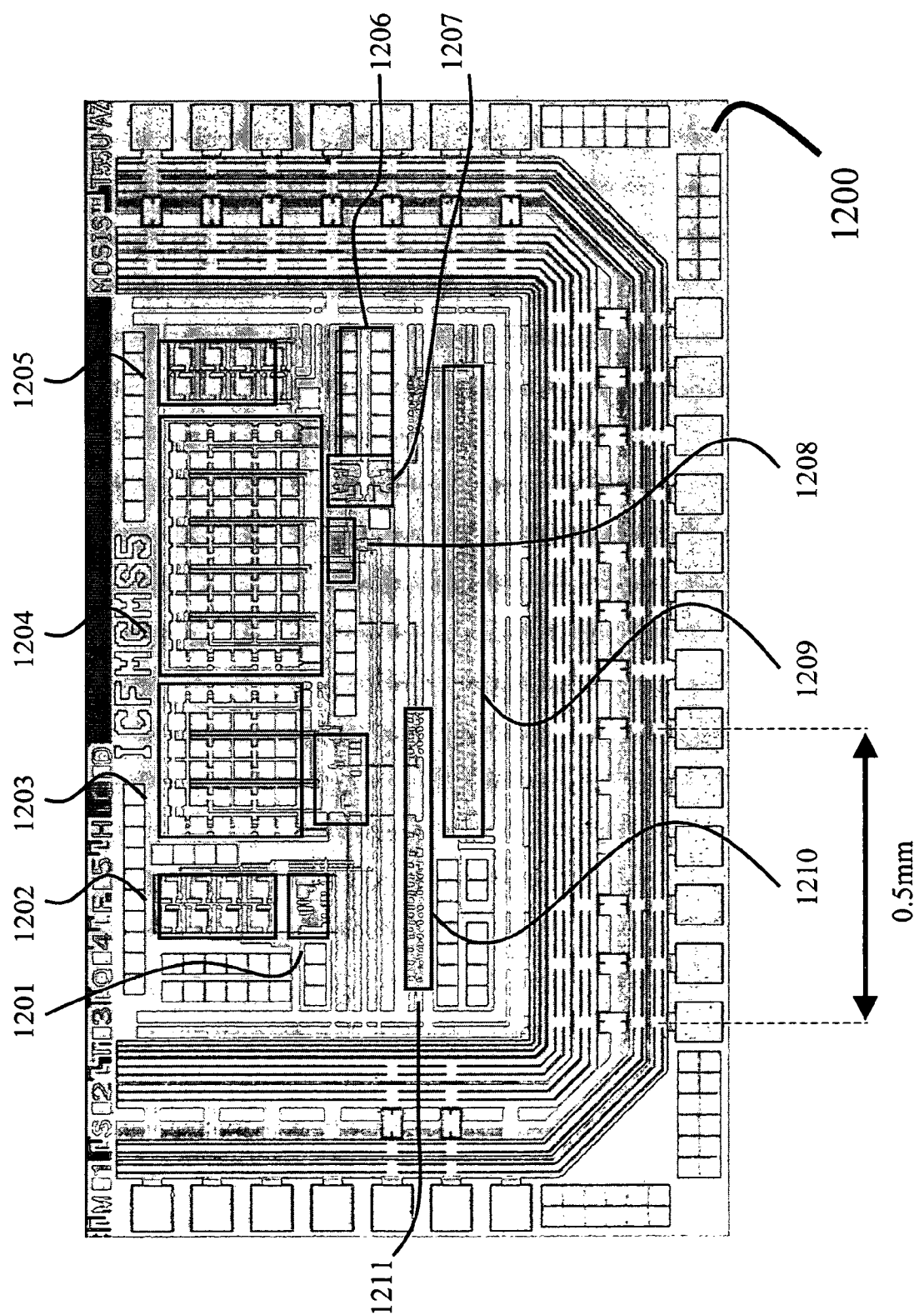
FIG. 12A illustrates a photomicrograph of a realized high-speed time domain analyzer function in a 0.18 μm CMOS IC.
Figure 12B:
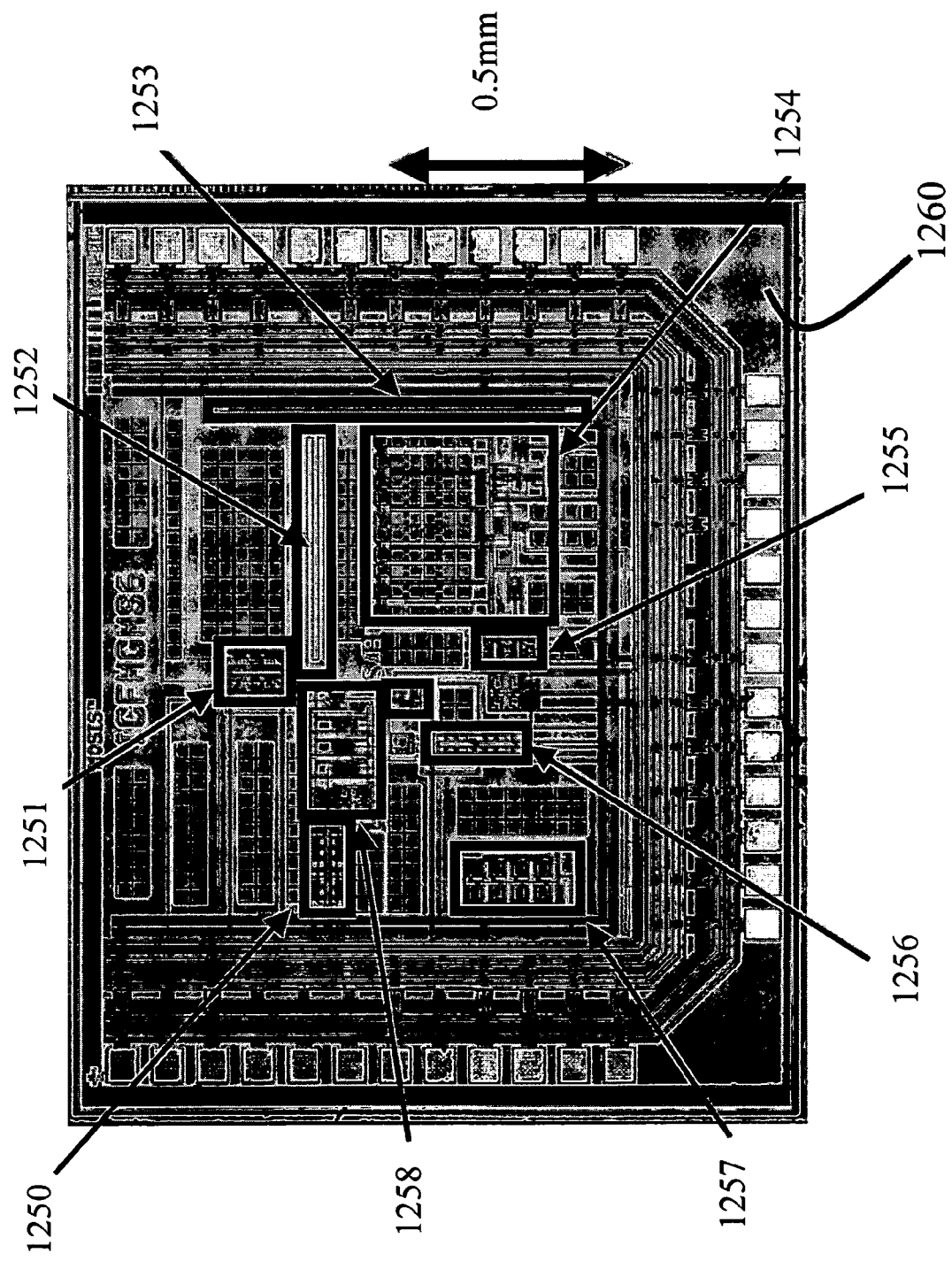
FIG. 12B illustrates a photomicrograph of a second circuit providing a realized high-speed time domain analyzer function in a 0.18 μm CMOS IC with the additional provision of calibration circuitry.

Referring FIG. 12B shown is a photomicrograph of a second circuit providing a realized high-speed time domain analyzer function in a 0.18 μm CMOS IC 1260 with the additional provision of calibration circuitry. The silicon die shown incorporates in the regions indicated the functions of VCD1 (clock interpolation) 1250, crosstalk generation control and calibration 1251 (part of the additional calibration function), transmissions lines 1252 for providing crosstalk generation (part of the additional calibration function), 6-bit time-to-data converter and parallel-to-serial converter 1253, time amplifiers and arbiters 1254, time amplifier input control and calibration 1255 (control functionality and part of the additional calibration function), VCD2 1256 (signal voltage to time conversion), decoupling capacitors 1257, and digital buffers 1258. As is evident from the photomicrograph of the 0.18 μm CMOS IC 1260 no attempts to optimize layout have been made as with CMOS IC 1200 of FIG. 12A.

Numerous other embodiments may be envisaged without departing from the spirit or scope of the invention.

What is claimed is:

1. A method of analysis of high speed signals comprising:
providing a signal;
providing at least a voltage threshold, each voltage threshold of the at least a voltage threshold being set at predetermined voltage for analysis of the signal;
establishing at least two of a plurality of time events, at least one of the plurality of time events relating to the signal crossing a voltage threshold of the at least a voltage threshold;
generating amplified time events by amplifying the time axis between the plurality of time events, the time amplification being determined by at least an amplification factor;
determining an amplified separation, the amplified separation being determined in dependence upon a time difference between at least two of the plurality of amplified time events; and
providing an output result, the output result comprising information relating to at least one of the time events and the amplified time events.

2. A method according to claim 1 wherein,
providing the output result comprises providing result data determined in dependence upon the amplified separation.

3. A method according to claim 2 wherein,
providing the output result comprises providing result data determined in dependence upon a scaling factor.

4. A method according to claim 3 wherein,
the scaling factor is provided by at least one of a predetermined design parameter and a measured parameter.

5. A method according to claim 4 wherein,
the measured parameter is obtained as the result of a calibration process.

6. A method according to claim 1 wherein,
providing the signal comprises providing a monitoring point within a circuit and monitoring an electrical signal associated with the monitoring point.

7. A method according to claim 1 wherein,
providing the signal comprises providing at least two of a plurality of monitoring points;
monitoring a monitoring signal for each of the at least two of a plurality of monitoring points; and
providing a switching matrix, the switching matrix having at least a matrix control port, the switching matrix for electrically coupling a selected one of the plurality of monitoring signals to provide the signal; wherein,
the selected one of the plurality of monitoring signals is determined in dependence upon a matrix control signal applied to the at least a matrix control port.

8. A method according to claim 1 wherein,
generating amplified time events comprises providing time events to one of a digital memory circuit and an analog circuit.

9. A method according to claim 1 wherein,
providing the amplification factor comprises providing the amplification factor at least in dependence upon a variable amplifier control signal.

10. A method according to claim 1 wherein,
determining the amplified separation comprises measuring a time difference between a first time event and a second time event.

11. A method according to claim 10 wherein,
measuring the time difference is determined in dependence upon a count from a counter.

12. A method according to claim 11 wherein,
the count from the counter is determined in dependence upon an initial count determined in dependence upon the first time event and a final count determined in dependence upon the second time event.

13. A method according to claim 1 wherein,
determining the time difference comprises providing the first and second time events to processing circuit.

14. A method according to claim 13 wherein,
the processing circuit comprises a phased-lock loop and a FIFO register.

15. A method of analysis of high speed signals comprising:
providing a signal;
providing at least a voltage threshold, the voltage threshold being set at predetermined voltage for analysis of the signal;
establishing at least two of a plurality of time events, at least one of the plurality of time events relating to the signal crossing the voltage threshold;
providing a time amplifier, the time amplifier for generating amplified time events by amplifying the time axis between the plurality of time events, the time amplifier being characterized by at least an amplification factor;
determining an amplified separation, the amplified separation being determined in dependence upon a time difference between at least two of the plurality of amplified time events;

determining an output result in dependence upon the amplified time results and a time difference between the at least two of the plurality of time events; and,
providing the output result.

16. A method according to claim 15 wherein,
providing a time amplifier comprises providing a time amplifier with a variable amplification factor.

17. A method according to claim 16 wherein,
providing the variable amplification factor comprises providing an amplification factor determined at least in dependence upon an amplifier control signal.

18. A method according to claim 15 wherein,
establishing a time event comprises providing a gated measurement signal and a gated reference signal to at least a decision making circuit.

19. A method according to claim 18 wherein,
providing the gated measurement signal comprises providing the signal to a first sample and hold circuit and gating a first output signal of the first sample and hold circuit with a first gate, the first gate being driven in dependence upon a first gate signal; and,
providing the gated reference signal comprises providing a predetermined reference voltage to a second sample and hold circuit and gating a second output signal of the second sample and hold circuit with a second gate, the second gate being driven with a second gate signal.

20. A method according to claim 19 wherein,
generating amplified time events comprises:
providing a variable edge signal generated in dependence upon the gated measurement signal;
providing a reference edge signal, wherein the reference edge signal is generated in dependence upon the gated reference signal; and
coupling the variable edge signal and reference edge signal to at least the time amplifier.

21. A method according to claim 18 wherein,
providing the time delay cell comprises providing first and second voltage controlled delay cells, each voltage controlled delay cell having an output port, an input port, and a delay port; wherein,
the signal ports of the third and fourth voltage controlled delay cells are provided with a common delay reference clock;
the first voltage controlled delay cell has the gated measurement signal applied to its delay port, a variable edge signal is generated in dependence upon the gated measurement signal and the common delay reference clock, the variable edge signal is provided at the output port, the variable edge signal being derived from the common delay reference clock and having a delay relative to the common delay reference clock, the delay being determined in dependence upon the gated measurement signal;
the second voltage controlled delay cell has the gated reference signal applied to its delay port, a reference edge signal is generated in dependence upon the gated reference signal and the common delay reference clock, the reference edge signal is derived from the common delay reference clock and having a delay relative to the common delay reference clock, the delay being determined in dependence upon the gated reference signal; and
the timing difference of related edges of the variable edge signal and reference edge signal determined in dependence upon at least a difference in voltage levels between the gated reference signal and gated measurement signal.

22. A method according to claim 20 wherein,
generating amplified time events comprises providing at least one of the variable edge signal and reference edge signal to the time amplifier.

23. A method according to claim 15 wherein,
the time amplifier comprises an electrical circuit.

24. A method according to claim 15 wherein,
providing the time amplifier comprises providing at least a time amplifier circuit comprising:
an amplifier input port for receiving an input signal;
a first charging circuit comprising an input terminal coupled to the amplifier input port, and being characterized by a first time constant;
a second charging circuit, the second charge circuit having an input terminal coupled to the amplifier input port, and being characterized by a second time constant;
a first amplifier output port electrically coupled to an output terminal of the first charging circuit; and,
a second amplifier output port electrically coupled to an output terminal of the second charging circuit.

25. A method according to claim 24 wherein,
an amplification factor of the time amplifier is determined in dependence upon the first and second time constants.

26. A method according to claim 25 wherein,
at least one of the first and second time constants is varied in dependence upon an amplifier control signal applied to the time amplifier.

27. A method according to claim 24 wherein,
at least one of the first charge circuit and second charge circuit comprises a capacitor.

28. A method according to claim 24 wherein,
the first and second time constants are other than same.

29. A method according to claim 24 wherein,
determining the amplified time difference is determined in dependence upon a start signal and a stop signal; wherein
the start signal is determined in dependence upon the signals present at one of the first output port and the second output port of each of the two time amplifier circuits, the first time amplifier circuit being applied to the variable edge signal and the second time amplifier circuit to the reference edge signal; and
the stop signal is determined in dependence upon the signals present at the other of the first output port and the second output port of each of the of the two time amplifier circuits.

30. A method according to claim 29 wherein,
the start signal is provided from one of the first and second output ports having a lower duration time constant.

31. A method according to claim 29 wherein,
the stop signal is provided from one of the first and second output ports having a longer duration time constant.

32. A method according to claim 29 wherein,
the start signal is determined in dependence upon a crossing point between signals at one of the first and second output ports having a lower duration time constant.

33. A method according to claim 29 wherein,
the stop signal is determined in dependence upon a crossing point between signals at one of the first and second output ports having a longer duration time constant.

34. A method according to claim 29 wherein,
determining the amplified separation is determined in dependence upon a count from a counter, the count determined in dependence upon the start signal and stop signal.

35. A method according to claim 24 wherein, determining the amplified separation is performed in dependence upon at least a signal from the first amplifier output port and a signal from the second amplifier output port.

36. A method of analysis of high speed signals comprising:
providing a signal;
providing at least a voltage threshold, the voltage threshold being set at predetermined voltage for analysis of the signal;
establishing at least two of a plurality of time events, at least one of the plurality of time events relating to the signal crossing the voltage threshold;
generating amplified time events by amplifying the time axis between the plurality of time events, the time amplification being determined by at least an amplification factor;
providing a time-to-data converter, the time-to-data converter for determining a time difference between at least two of the plurality of amplified time events; and
providing an output result, the output result comprising information determined in dependence upon the amplified time results and a time difference between at least two of the plurality of time events.

37. A method according to claim 36 wherein,
providing an amplification factor for the time amplifier comprises providing an amplification factor determined at least in dependence upon an amplifier control signal.

38. A method according to claim 36 wherein,
providing the time-to-data converter comprises providing an electrical circuit.

39. A method according to claim 36 wherein,
providing the time-to-data converter comprises providing at least a flash time-to-data converter.

40. A method according to claim 39 comprising a logic level array; wherein,
providing the at least a flash time-to-data converter comprises providing at least one of a plurality of time delay elements, each of the plurality of time delay elements having an input time port and an output time port, the plurality of time delay elements arranged sequentially such that, except for the first of the plurality of time delay elements the input time port of a time delay element is coupled to the output time port of the preceding time delay element, each of the plurality of time delay elements being coupled to at least one of a plurality of first logic gates; each of the plurality of first logic gates having at least an input logic port and an output logic port, and wherein the logic level array comprises a plurality of the output logic ports.

41. A method according to claim 40, wherein,
providing the output result comprises providing output data determined in dependence upon a transition between logic levels within the logic level array.

42. A method according to claim 39, wherein,
providing the at least a flash time-to-data converter comprises providing at least one of a plurality of time delay elements and at least one of a plurality of logic gates, wherein each time delay element comprises a time delay input port, the time input delay port for receiving a start signal when the time delay element is the first in a sequential arrangement of time delay elements, and a delayed start signal from a preceding time delay element when the time delay element is other than the first in the sequential arrangement, and a time delay output port for providing a delayed start signal, the delayed start signal being the start signal with a delay added, the delay being a predetermined value; and,
each logic gate comprises a D-input port, the D-input port for receiving a delayed start signal from one of the time delay elements, a first logic clock input port, the first logic clock input port for receiving a first logic clock signal, and a Q-output port, the Q-output port for providing a Q-output signal in dependence upon at least the D-input port signal and first logic clock signal.

43. A method according to claim 42 comprising a logic level array, wherein,
the logic level array comprises a plurality of the Q-output ports.

44. A method according to claim 43, wherein,
providing the output result comprises providing output data determined in dependence upon a transition between logic levels within the logic level array.

45. A method according to claim 39 wherein,
providing the flash time-to-data converter comprises providing a logic level array output and,
providing a logic converter for converting the logic level array to flash data.

46. A method according to claim 45 wherein,
each array element of the logic level array comprises at least one of a first logic level and a second logic level, and each bit of the flash data is determined in dependence upon at least a state of a predetermined array element of the logic level array.

47. A method according to claim 45 wherein,
the flash data is a digital word.

48. A method according to claim 39 wherein,
providing the flash time-to-data converter comprises providing an output signal comprising serial data.

49. A method according to claim 48 wherein,
the serial data is determined in dependence upon at least a timing difference between two amplified time events.

50. A method according to claim 48 wherein,
the serial data is a digital word.

51. A method of analysis of high speed signals comprising:
providing a sampled signal;
providing a plurality of voltage thresholds, each of the plurality of voltage thresholds being a predetermined voltage for analysis of the signal;
establishing at least two of a plurality of time events, at least one of the plurality of time events relating to the signal crossing one of the plurality of voltage thresholds;
generating amplified time events by amplifting the time axis between the plurality of time events, the time amplification being determined by at least an amplification factor;
determining an amplified separation, the amplified separation being a time difference between at least two of the plurality of amplified time events; and
determining an output result in dependence upon the amplified time results and a time difference between at least two of the plurality of time events; and,
providing the output result.

52. A method according to claim 51 wherein,
providing the sampled signal comprises providing a signal to an electrical circuit.

53. A method according to claim 52 wherein,
the electrical circuit comprises at least one of a sample and hold circuit and an electrical switch, the electrical switch operable in response to providing a switch signal applied to a switch port of the electrical switch.

54. A method according to claim 52 wherein,
providing the switch signal comprises providing a clock signal.

55. A method according to claim 51 wherein,
providing each of the plurality of voltage thresholds comprises providing a reference voltage, the reference voltage being provided by at least one of a fixed voltage supply, a programmable voltage supply, a digital-to-analog converter, and an oscillator.

56. A method according to claim 51 wherein,
providing the voltage threshold comprises providing the reference voltage from a sample and hold circuit.

57. A method according to claim 51 wherein,
providing the voltage threshold comprises providing a reference voltage from at least one of a sample and hold circuit and an electrical switch, the electrical switch operable in response to providing a switch signal applied to a switch port of the electrical switch.

58. A method according to claim 57 wherein,
providing the switch signal comprises providing a clock signal.

59. A method according to claim 51 wherein,
providing the sampled signal comprises providing a signal from at least one of a sample and hold circuit and a first electrical switch, the electrical switch operable in response to providing a sampled switch signal applied to a switch port of the first electrical switch, and
providing the voltage threshold comprises providing a reference voltage from at least one of a sample and hold circuit and a second electrical switch, the second electrical switch operable in response to a threshold switch signal applied to a switch port of the electrical switch.

60. A method according to claim 59 wherein,
providing the sampled switch signal comprises providing a first clock signal; and
providing the threshold switch signal comprises providing a second clock signal.

61. A method according to claim 59 wherein,
providing the first and second switch signals comprises providing two clock signals, the two clock signals being other than independent.

62. A method according to claim 61 wherein,
providing the two clock signals with a relationship comprises offsetting at least an edge of one of the clock signals relative to the other in proportion to a clock control signal.

63. A method according to claim 51 wherein,
providing the sampled signal and voltage threshold comprises providing at least an electrical switch for each of the sampled signal and voltage threshold, each electrical switch operable in response to providing a clock signal applied to a switch port of the electrical switch; wherein
providing each clock signal comprises providing a voltage controlled delay cell, the voltage controlled delay cell having an output port, a signal port and a delay port; wherein
the signal port of the voltage controlled delay cell is provided with a common reference clock;
the delay port of the voltage controlled delay cell is provided with a delay voltage; and
the output port of the voltage controlled delay cell is for providing a clock edge signal, the clock edge signal being a replica of the common reference clock where the clock edge signal is delayed by a delay determined in dependence upon delay voltage.

64. A method according to claim 63 wherein,
providing the sampled signal comprises providing the clock signal for the electrical switch from a voltage controlled delay cell wherein a variable voltage signal is coupled to the delay port of the voltage controlled delay cell.

65. A method according to claim 64 wherein;
providing the variable voltage signal to the delay port of the voltage controlled delay cell results in the clock edge signal being derived from the common reference clock but having a variable delay of at least one clock edge relative to the common reference clock.

66. A method according to claim 63 wherein,
providing the voltage threshold comprises providing the clock signal for the electrical switch from a voltage controlled delay cell that has a constant voltage signal coupled to its delay port.

67. A method according to claim 51 wherein,
establishing time events comprises providing at least one of a crossing detector and a voltage to time converter.

68. A method according to claim 51 wherein, providing at least one of a crossing detector and a time to voltage converter comprises providing at least one of a crossing detector and voltage to time converter with at least the sampled signal and one of the plurality of voltage thresholds.

69. A method according to claim 51 wherein,
providing an amplification factor for the time amplifier comprises providing an amplification factor determined at least in dependence upon an amplifier control signal.

70. An integrated circuit comprising:
a signal circuit, the signal circuit for providing a signal, the signal being a high speed signal;
a voltage threshold circuit, the voltage threshold circuit for providing at least a voltage threshold, the at least a voltage threshold being set at predetermined voltage for analysis of the signal;
a time event circuit, the time event circuit for establishing at least two of a plurality of time events, each of the plurality of time events relating to the signal crossing the at least a voltage threshold;
a time amplifier, the time amplifier for generating amplified time events by amplifying the time axis between the plurality of time events, the time amplification being determined by at least an amplification factor;
a timing circuit, the timing circuit for determining an amplified separation, the amplified separation being a time difference between at least two of the plurality of amplified time events; and
a result circuit, the result circuit for providing an output result, the output result comprising information determined in dependence upon the amplified time results and a time difference between at least two of the plurality of time events.

71. An integrated circuit according to claim 70 wherein,
the integrated circuit comprises at least one of a hybrid integrated circuit and a monolithic integrated circuit.

72. An integrated circuit according to claim 70 wherein,
the integrated circuit comprises a semiconductor circuit manufactured using a semiconductor technology based upon at least one of silicon, silicon-germanium, gallium arsenide, indium phosphide, gallium nitride and polymers.

73. An integrated circuit according to claim 70 comprising:
a switch matrix, the switch matrix comprising:
at least one of a plurality of switch input ports, the plurality of switch input ports for receiving measurements signals;
a switch output port, the switch output port for providing the signal, the signal being one of the measurement signals; and,
a switch select port, the switch select port for receiving a switch state signal, wherein, some of the plurality of measurement signals are coupled to the switch output port in dependence upon the switch state signal.

74. An integrated circuit according to claim 70, comprising:
   a functional circuit, the functional circuit for performing a predetermined function and comprising at least one of a plurality of monitoring points, each of the plurality of monitoring points for providing a measurement signal determined at least in part from a signal coupled from that monitoring point; and
   a switch matrix, the switch matrix comprising at least one of a plurality of switch input ports, the plurality of switch input ports being electrically coupled to the plurality of monitoring points, a switch output port, the switch output port for providing the signal, the signal being one of the measurement signals, and a switch select port, the switch select port for receiving a switch state signal, wherein;
   the switch state signal is for determining which of the plurality of measurement signals to couple to the switch output port as the signal.

75. An integrated circuit according to claim 74, wherein, the monitoring point comprises at least one of a coupler, a duplication circuit for replicating a functional signal, and a functional circuit port, the functional circuit port being provided within the functional circuit to provide specific signals for assessing the functional circuit.

76. An integrated circuit according to claim 74, comprising:
   a functional testing circuit, the functional testing circuit for at least one of providing predetermined signals to the functional circuit, establishing predetermined parameters for at least an active element within the functional circuit, establishing at least one of a plurality of predetermined modes for the functional circuit, and determining the specific signal provided to the functional circuit port.

77. An integrated circuit according to claim 70 comprising:
   a functional testing circuit, the functional testing circuit for at least of one providing predetermined signals to a circuit under test, establishing predetermined parameters for at least an active element within a circuit under test, establishing at least one of a plurality of predetermined modes for a circuit under test, and determining at least a specific signal provided to a circuit under test.

78. An integrated circuit according to claim 70, comprising:
   a calibration circuit, the calibration circuit for at least providing one of a plurality of predetermined signals, the plurality of predetermined signals providing for at least one of establishing at least two of a plurality of time events, obtaining amplified time events, determining the amplified separation between amplified time events, and converting the amplified separation; wherein
   providing the plurality of predetermined signals results in an outcome, the outcome for providing calibration data.

79. An integrated circuit according to claim 78, wherein, the calibration circuit additionally comprises calibration control circuitry for coupling the plurality of predetermined signals to appropriate signal ports within the integrated circuit.

80. An integrated circuit according to claim 70 comprising:
   a memory, the memory comprising at least a memory access port and a memory element, the memory element for storing the amplification factor of the time amplifier and the memory access port supporting communication of the amplification factor to other circuitry.

81. An integrated circuit according to claim 78, wherein, the calibration circuit further comprises a calibration memory, the calibration memory comprising at least a memory access port and a memory element, the memory element for storing the amplification factor of the time amplifier and the memory access port supporting communication of the amplification factor to at least other circuitry and the calibration circuit for storing the result of a calibration performed using the calibration circuit.

82. A method according to claim 70 wherein, providing an amplification factor for the time amplifier comprises providing an amplification factor determined at least in dependence upon an amplifier control signal.

* * * * *